US012660620B2

(12) United States Patent
Kuo et al.

(10) Patent No.: US 12,660,620 B2
(45) Date of Patent: Jun. 16, 2026

(54) PACKAGE WITH IMPROVED HEAT DISSIPATION EFFICIENCY AND METHOD FOR FORMING THE SAME

(71) Applicant: Taiwan Semiconductor Manufacturing Co., Ltd., Hsinchu (TW)

(72) Inventors: Hung-Yi Kuo, Taipei City (TW); Chen-Hua Yu, Hsinchu (TW); Kuo-Chung Yee, Taoyuan City (TW); Yu-Jen Lien, Tainan City (TW); Ke-Han Shen, Chiayi City (TW); Wei-Kong Sheng, Chu-Nan (TW); Chung-Shi Liu, Hsinchu (TW); Szu-Wei Lu, Hsinchu (TW); Tsung-Fu Tsai, Changhua City (TW); Chung-Ju Lee, Hsinchu (TW); Chih-Ming Ke, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 666 days.

(21) Appl. No.: 18/152,615

(22) Filed: Jan. 10, 2023

(65) Prior Publication Data

US 2024/0162109 A1 May 16, 2024

Related U.S. Application Data

(60) Provisional application No. 63/424,387, filed on Nov. 10, 2022.

(51) Int. Cl.
*H10W 40/22* (2026.01)
*H10B 80/00* (2023.01)
(Continued)

(52) U.S. Cl.
CPC .......... *H10W 40/228* (2026.01); *H10B 80/00* (2023.02); *H10W 40/258* (2026.01);
(Continued)

(58) Field of Classification Search
None
See application file for complete search history.

(56) References Cited

U.S. PATENT DOCUMENTS

| 8,546,935 | B2 | 10/2013 | Mouli et al. |
| 11,043,440 | B2 | 6/2021 | Kim et al. |

(Continued)

FOREIGN PATENT DOCUMENTS

| TW | 200802758 A | 1/2008 |
| TW | 202046467 A | 12/2020 |

*Primary Examiner* — Nicholas J Tobergte
(74) *Attorney, Agent, or Firm* — Slater Matsil, LLP

(57) ABSTRACT

In an embodiment, a package includes an integrated circuit device attached to a substrate; an encapsulant disposed over the substrate and laterally around the integrated circuit device, wherein a top surface of the encapsulant is coplanar with the top surface of the integrated circuit device; and a heat dissipation structure disposed over the integrated circuit device and the encapsulant, wherein the heat dissipation structure includes a spreading layer disposed over the encapsulant and the integrated circuit device, wherein the spreading layer includes a plurality of islands, wherein at least a portion of the islands are arranged as lines extending in a first direction in a plan view; a plurality of pillars disposed over the islands of the spreading layer; and nanostructures disposed over the pillars.

20 Claims, 27 Drawing Sheets

(51) Int. Cl.

| | |
|---|---|
| *H10W 40/25* | (2026.01) |
| *H10W 74/01* | (2026.01) |
| *H10W 74/10* | (2026.01) |
| *H10W 72/00* | (2026.01) |
| *H10W 72/30* | (2026.01) |
| *H10W 74/15* | (2026.01) |
| *H10W 90/00* | (2026.01) |

(52) U.S. Cl.
CPC .......... *H10W 74/01* (2026.01); *H10W 74/117* (2026.01); *H10W 72/07354* (2026.01); *H10W 72/347* (2026.01); *H10W 72/352* (2026.01); *H10W 72/877* (2026.01); *H10W 74/15* (2026.01); *H10W 90/724* (2026.01); *H10W 90/736* (2026.01)

(56) References Cited

U.S. PATENT DOCUMENTS

| | | | | |
|---|---|---|---|---|
| 2007/0044941 A1* | 3/2007 | Kuo | .................... | H01L 23/3733 |
| | | | | 165/907 |
| 2019/0006269 A1* | 1/2019 | Xu | ...................... | H01L 23/3677 |

\* cited by examiner

PACKAGE WITH IMPROVED HEAT DISSIPATION EFFICIENCY AND METHOD FOR FORMING THE SAME

PRIORITY CLAIM AND CROSS-REFERENCE

This application claims the benefit of U.S. Provisional Application No. 63/424,387, filed on Nov. 10, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
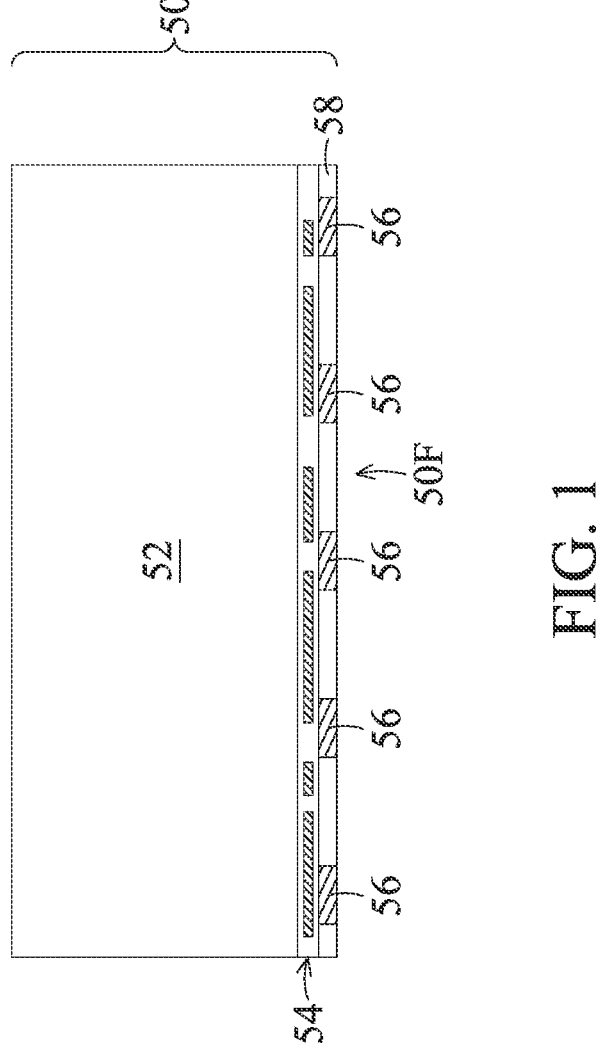
FIG. 1 is a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a package is formed that includes integrated circuit devices attached to a substrate, such as an interposer. The integrated circuit device may include a heat dissipation structure over the integrated circuit devices. The heat dissipation structure may include macrostructures which may increase the surface area of the heat dissipation structure as compared to a flat surface. The heat dissipation structure also includes microstructures for increasing the wicking rate of the surface of the heat dissipation structure. Thus, the heat dissipation capacity and efficiency of the integrated circuit package may be improved.

FIG. 1 is a cross-sectional view of an integrated circuit die 50. One or more integrated circuit dies 50 will be packaged in subsequent processing to form integrated circuit packages. Each integrated circuit die 50 may be a logic die (e.g., central processing unit (CPU), graphics processing unit (GPU), microcontroller, etc.), a memory die (e.g., dynamic random access memory (DRAM) die, static random access memory (SRAM) die, etc.), hybrid memory cube (HMC) module, a high bandwidth memory (HBM) module, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), an application-specific integrated circuit (ASIC) die, the like, or combinations thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58 (if present).

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing downward in FIG. 1) and an inactive surface (e.g., the surface facing upward in FIG. 1). Devices are at the active surface of the semiconductor substrate 52. The devices may be active devices (e.g., transistors, diodes, etc.) and/or passive devices (e.g., capacitors, resistors, etc.). The inactive surface may be free from devices.

The interconnect structure 54 is on the active surface of the semiconductor substrate 52, and is used to electrically connect the devices of the semiconductor substrate 52 to form an integrated circuit. The interconnect structure 54 may include one or more dielectric layer(s) and respective one or more metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

A dielectric layer 58 is optionally disposed at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during the formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are coplanar (within process variations) and are exposed at the front side 50F of the integrated circuit die 50.

Figure 2:
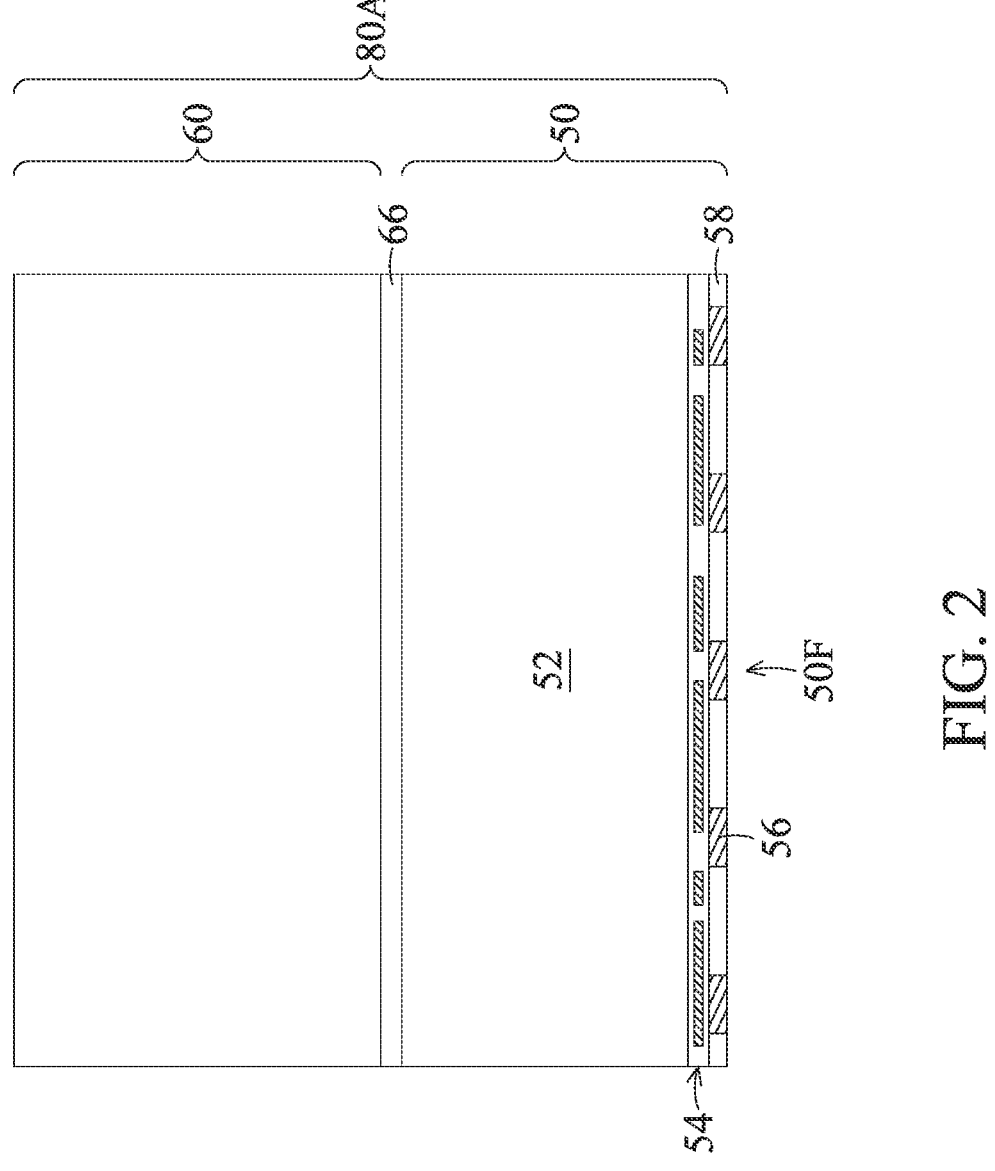
FIG. 2 is a cross-sectional view of an integrated circuit device, in accordance with some embodiments.

FIG. 2 is a cross-sectional view of a first integrated circuit device 80A, respectively, in accordance with some embodiments. The first integrated circuit device 80A may include a first heat dissipation structure 60 attached to the integrated circuit die 50 (see, e.g., FIG. 1). In some embodiments, the first heat dissipation structure 60 includes a bulk substrate and may not include metallization layer(s), active or inactive devices, or the like. The bulk substrate may be formed of a material with high thermal conductivity, such as silicon, a semiconductor material similar to the semiconductor substrate 52, or the like. The first heat dissipation structure 60 may also be referred to as a dummy die or as a thermal enhancement die. In some embodiments, the first heat dissipation structure 60 is Cu or Ni, an alloy thereof, a combination thereof, or the like.

The first heat dissipation structure 60 may be attached to the integrated circuit die 50 through direct bonding or an adhesive layer. For example, in some embodiments in which the first heat dissipation structure 60 is attached to the integrated circuit die 50 through direct bonding, a bottom surface of the first heat dissipation structure 60 is directly bonded to the inactive surface of the integrated circuit die 50. In such embodiments, a bonding film 66 such as a silicon oxide layer may be formed on one or both the bulk substrate of the first heat dissipation structure 60 and the semiconductor substrate 52 of the integrated circuit die 50 to aid in the bonding process. In embodiments in which the first heat dissipation structure 60 is attached to the integrated circuit die 50 through an adhesive layer, the bonding film 66 may be a thermal interface material (TIM). The thermal interface material may be a polymeric material, solder paste, indium solder paste, or the like.

In some embodiments, the attachment of the first heat dissipation structure 60 and the integrated circuit die 50 may be performed in a wafer level. For example, a blank wafer may be attached to an inactive surface of a semiconductor substrate (e.g., inactive surface of the semiconductor substrate 52), such as by a wafer-to-wafer bonding. The wafer-to-wafer bonding may be performed using direct bonding or adhesion using, e.g., the bonding film 66 as discussed above. Although not illustrated in detail here, it is appreciated that the wafer-to-wafer bonding may be implemented by other suitable techniques. After the attachment, the structure of the blank wafer 60A, the bonding film 66, and the wafer 50A may be singulated, such as along the scribe lines between the integrated circuit dies 50 to form individual bonded die structures. The individual bonded die structures may be the first integrated circuit device 80A illustrated in FIG. 2A.

Figure 3:
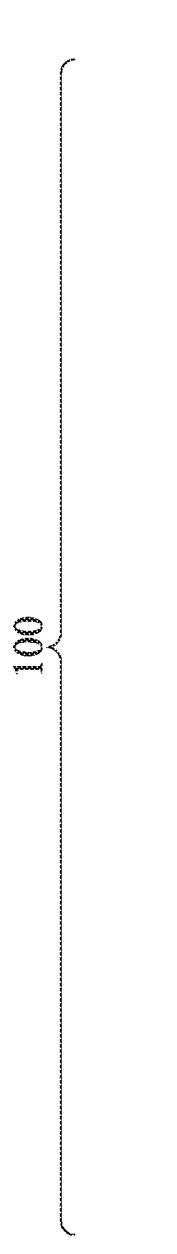
FIGS. 3, 4, 5, 6, 7, 8, 9, 10, 11A, 12A, 13, 14, and 15 are cross-sectional views of intermediate stages in the manufacturing of an integrated circuit device, in accordance with some embodiments.
Figure 3:
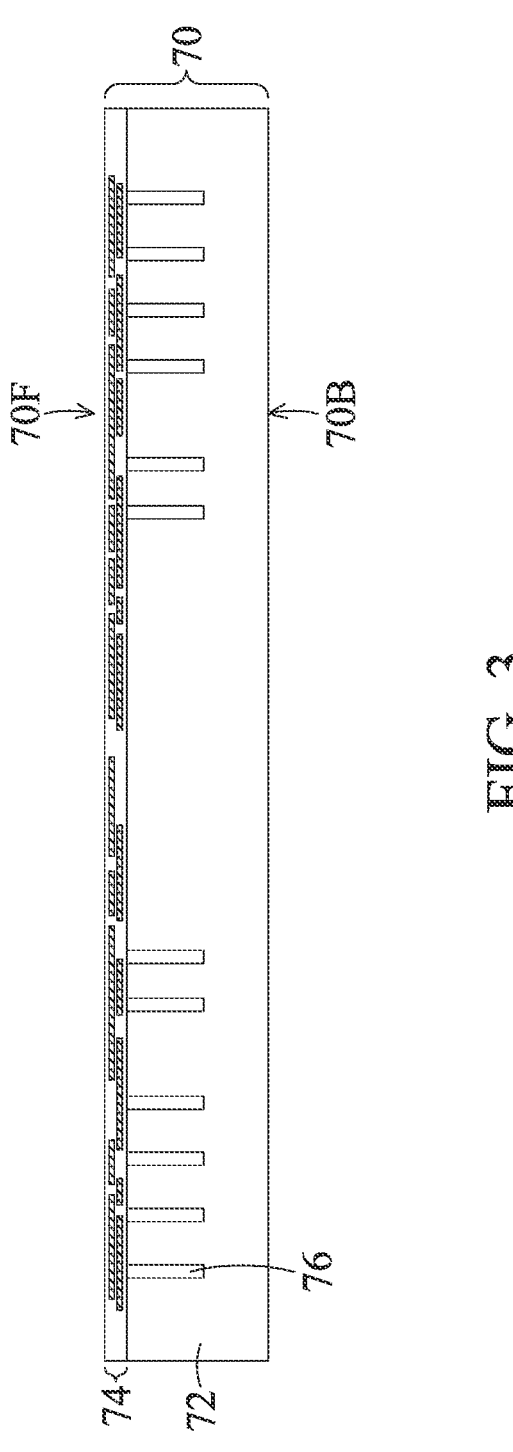

FIGS. 3, 4, 5, 6, 7, 8, 9, 10, 11A, 12A, 13, and 14 are cross-sectional views of intermediate stages in the manufacturing of an integrated circuit package 100 comprising the first integrated circuit device 80A (see FIG. 2), in accordance with some embodiments. In some embodiments, FIGS. 11B to 11D and 12B to 12D are top views of intermediate stages in the manufacturing of the integrated circuit package 100, and the above cross-sectional view Figures are taken along the section A-A as illustrated in FIGS. 11B and 12B. Referring first to FIG. 3, an interposer 70 is shown. The interposer 70 may be a wafer, and a plurality of the first integrated circuit devices 80A may be attached to the interposer 70 using chip-on-wafer (CoW) techniques and later singulated to form individual packages. It is also appreciated that the embodiments illustrated in this disclosure may also be applied to various types of 3DIC packages.

Figure 4:
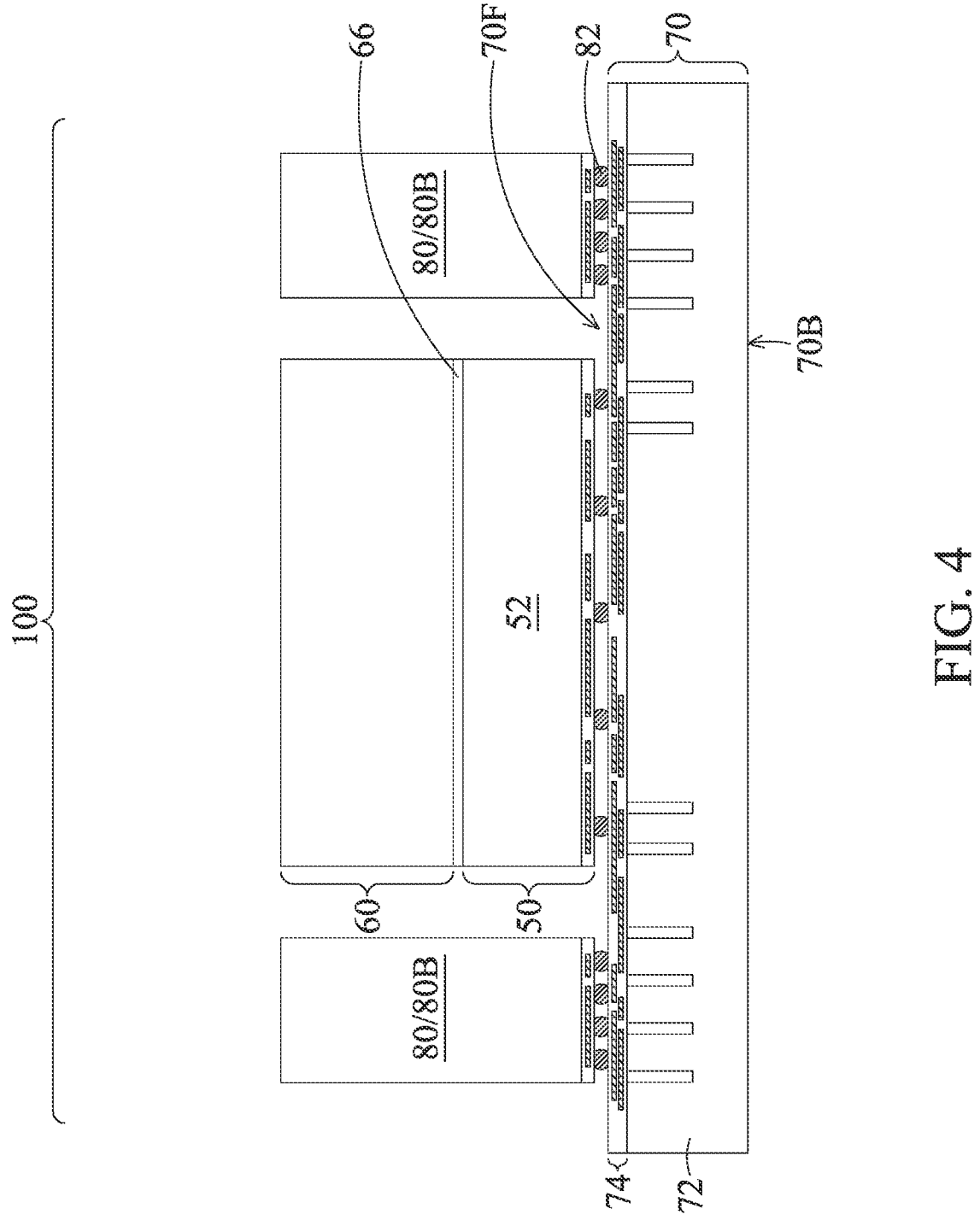

In FIG. 4, the interposer 70 is obtained or formed. In some embodiments, the interposer 70 includes a substrate 72, an interconnect structure 74, and through vias 76. The substrate 72 may be a bulk semiconductor substrate, a semiconductor-on-insulator (SOI) substrate, a multi-layered semiconductor substrate, or the like. The substrate 72 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 72 may be doped or undoped. In some embodiments, the substrate 72 does not include active devices therein, although the interposers may include passive devices formed in and/or on a front surface (e.g., the surface facing upward in FIG. 3) of the substrate 72.

The interconnect structure 74 is over the front surface of the substrate 72, and is used to electrically connect the devices (if any) of the substrate 72 and/or the devices attached to the interposer 70. The interconnect structure 74 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobutene (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The interconnect structure 74 may be formed by a damascene process, such as a single damascene process, a dual damascene process, or the like.

In some embodiments, die connectors and a dielectric layer (not separately illustrated) are at the front side 70F of the interposer 70. Specifically, the interposer 70 may include die connectors and a dielectric layer that are similar to those of the integrated circuit die 50 described for FIG. 1. For example, the die connectors and the dielectric layer may be part of an upper metallization layer of the interconnect structure 74.

The through vias 76 extend into the interconnect structure 74 and/or the substrate 72. The through vias 76 are electrically connected to metallization layer(s) of the interconnect structure 74. As an example to form the through vias 76, recesses can be formed in the interconnect structure 74 and/or the substrate 72 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 74 or the substrate 72 by, for example, a CMP. Remaining portions of the barrier layer and conductive material form the through vias 76.

FIG. 4 illustrates the first integrated circuit device 80A and the second integrated circuit devices 80B attached to the interposer 70, wherein the second integrated circuit devices 80B and the first integrated circuit device 80A are collectively referred to as integrated circuit devices 80. The second integrated circuit devices 80B may be a memory die, a stack of memory dies, an integrated circuit die (similar to the integrated circuit die 50 described for FIG. 1), or a stack of the integrated circuit dies, or the like. The first integrated circuit device 80A may have a different function from the second integrated circuit devices 80B. For example, the first integrated circuit device 80A may be a logic device, such as a central processing unit (CPU), graphics processing unit (GPU), system-on-a-chip (SoC), microcontroller, application-specific integrated circuit (ASIC), or the like. The second integrated circuit device 80B may be a memory device, such as a dynamic random access memory (DRAM) device, static random access memory (SRAM) device, hybrid memory cube (HMC) module, a high bandwidth memory (HBM) module, or the like. The first integrated circuit device 80A and the second integrated circuit devices 80B may be formed in processes of a same technology node, or may be formed in processes of different technology nodes. For example, the first integrated circuit device 80A may be of a more advanced process node than the second integrated circuit device 80B.

In FIG. 4, the integrated circuit devices 80 are attached to the interposer 70 with solder bonds, such as with conductive connectors 82. The integrated circuit devices 80 may be placed on the interconnect structure 74 using, e.g., a pick-and-place tool. The conductive connectors 82 may be formed of a reflowable conductive material, such as solder, and may further include other conductive materials such as copper, aluminum, gold, nickel, silver, palladium, tin, lead, the like, or a combination thereof. In some embodiments, the conductive connectors 82 are formed by initially forming a layer of solder through methods such as evaporation, electroplating, printing, solder transfer, ball placement, or the like. Once a layer of solder has been formed on the interposer 70, a reflow may be performed in order to shape the conductive connectors 82 into desired bump shapes. Attaching the integrated circuit devices 80 to the interposer 70 may include placing the integrated circuit devices 80 on the interposer 70 and reflowing the conductive connectors 82. The conductive connectors 82 form joints between corresponding die connectors of the interposer 70 and the integrated circuit devices 80, electrically connecting the interposer 70 to the integrated circuit devices 80.

An underfill 84 may be formed around the conductive connectors 82, and between the interposer 70 and the integrated circuit devices 80. The underfill 84 may reduce stress and protect the joints resulting from the reflowing of the conductive connectors 82. The underfill 84 may be formed of an underfill material such as an epoxy, or the like. The underfill 84 may be formed by a capillary flow process after the integrated circuit devices 80 are attached to the interposer 70, or may be formed by a suitable deposition method before the integrated circuit devices 80 are attached to the interposer 70. The underfill 84 may be applied in liquid or semi-liquid form and then subsequently cured. The underfill 84 may have various heights, depending on the distances between the first integrated circuit device 80A and the second integrated circuit devices 80B. In the embodiment shown, the underfill 84 may have a height greater than integrated circuit die 50 and in contact with sidewalls of the first heat dissipation structure 60 of the first integrated circuit device 80A. In some embodiments not shown in Figures, the underfill 84 has a top surface level with the top surface of the first heat dissipation structure 60.

Figure 5:
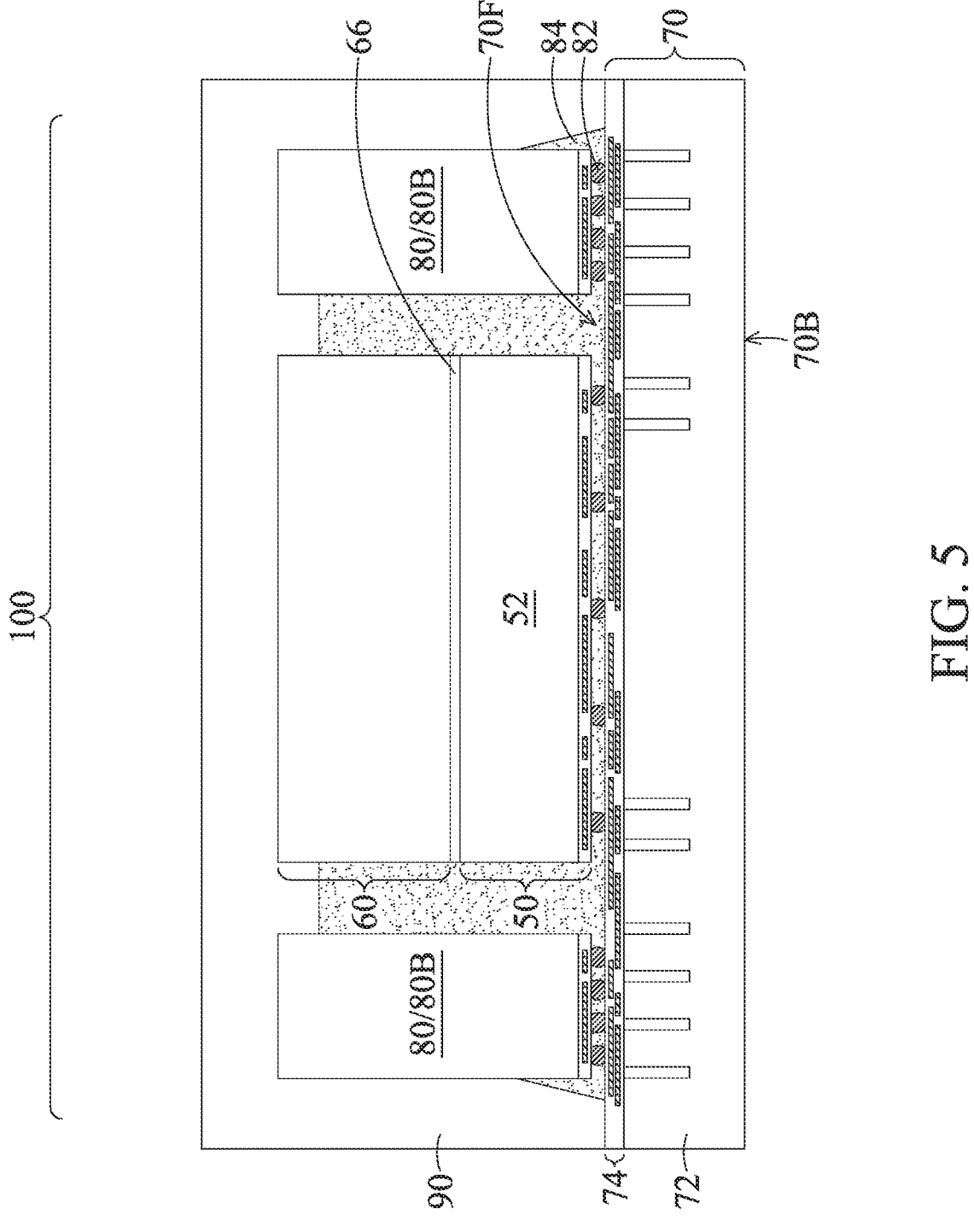

In FIG. 5, an encapsulant 90 is formed over the interposer 70 and the various components on the interposer 70. After formation, the encapsulant 90 encapsulates the integrated circuit devices 80 and the underfill 84. The encapsulant 90 may be a molding compound, which may be a polymer, a resin, an epoxy, or the like, and filler particles in the base material. The filler particles may be dielectric particles of $SiO_2$, $Al_2O_3$, or the like, and may have spherical shapes. Also, the spherical filler particles may have a plurality of different diameters. The encapsulant 90 may be applied by compression molding, transfer molding, or the like, and is formed over the interposer 70 such that the first heat dissipation structure 60 and the integrated circuit devices 80 are buried or covered. The encapsulant 90 may be applied in liquid or semi-liquid form and then subsequently cured.

Figure 6:
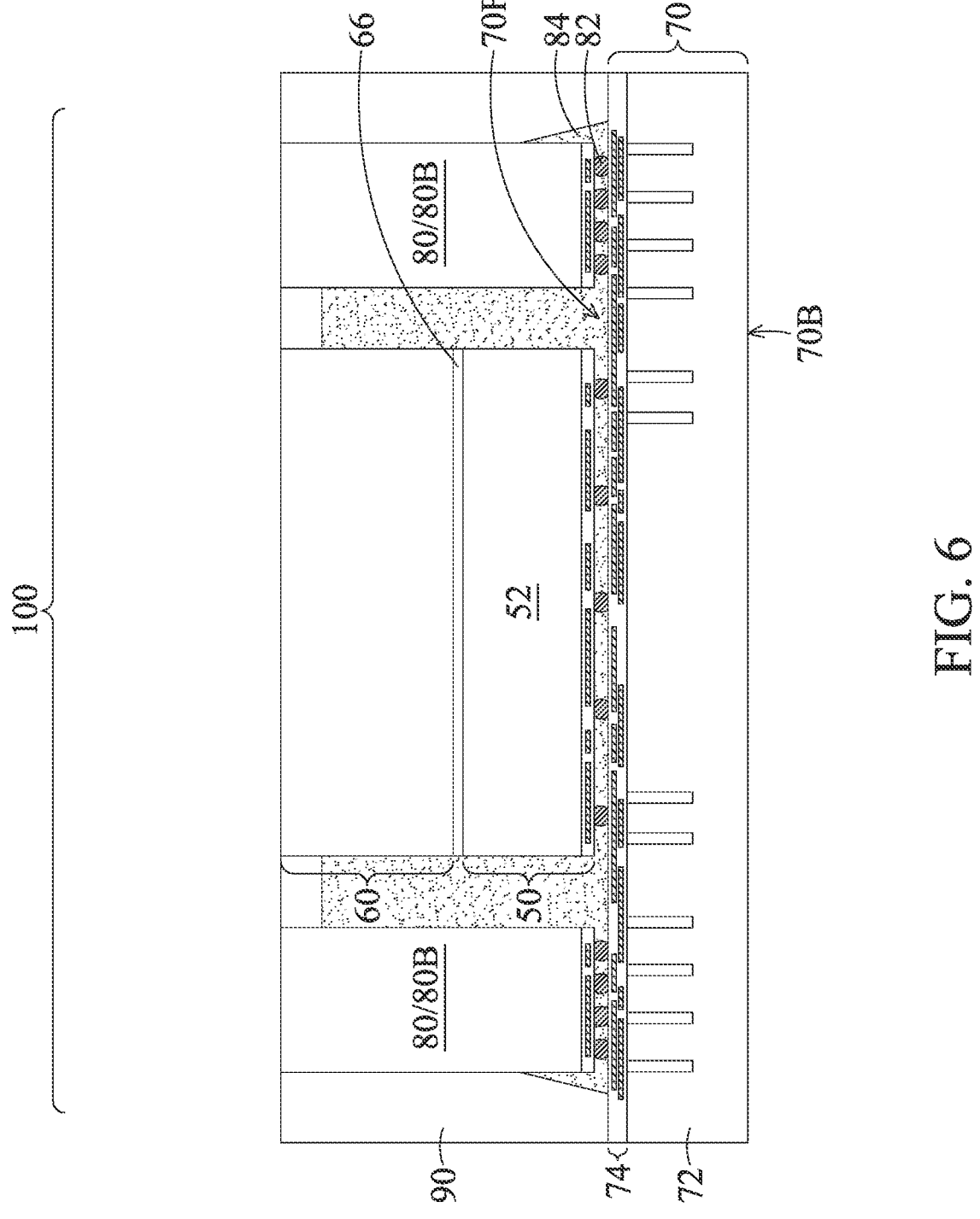
Figure 9:
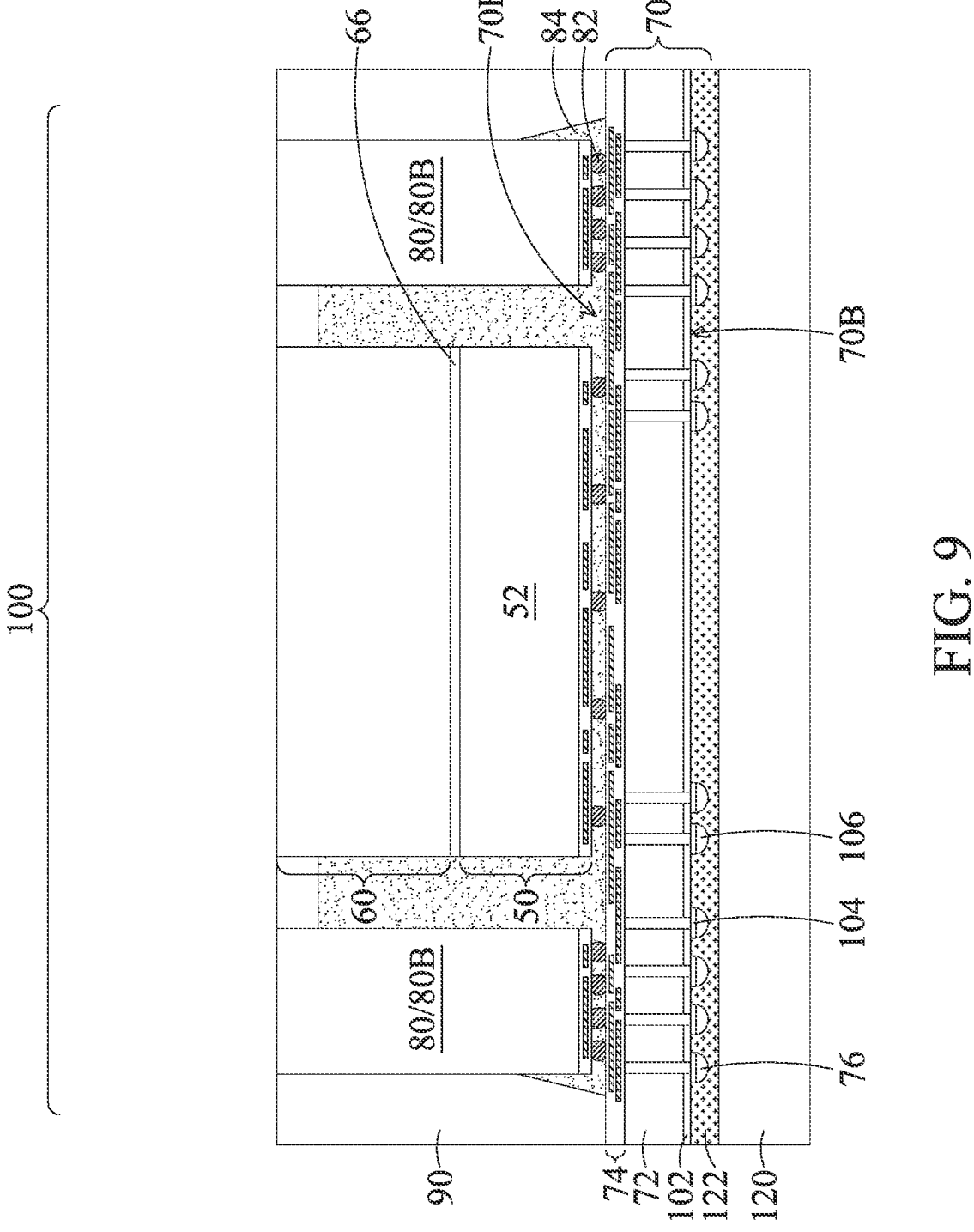

In FIG. 6, the encapsulant 90 is thinned to expose the first integrated circuit device 80A. In some embodiments, the second integrated circuit devices 80B may also be exposed as illustrated in FIG. 9. Specifically, the thinning removes the portions of the encapsulant 90 covering the top surface of the first heat dissipation structure 60 of the first integrated circuit device 80A, thereby exposing the first heat dissipation structure 60. In some embodiments, the thinning also includes removing a portion of the second integrated circuit devices 80B and/or a portion of the first heat dissipation structure 60 of the first integrated circuit device 80A. After the thinning process, the top surfaces of the first heat dissipation structure 60 of the first integrated circuit device 80A and the encapsulant 90 are coplanar (within process variations). Additionally, top surface of one or more of the second integrated circuit devices 80B may also be coplanar (within process variations) with top surfaces of the first heat dissipation structure 60 of the first integrated circuit device 80A and the encapsulant 90. The thinning process may be a grinding process, a chemical-mechanical polish (CMP), an etch-back, combinations thereof, or the like.

Figure 7:
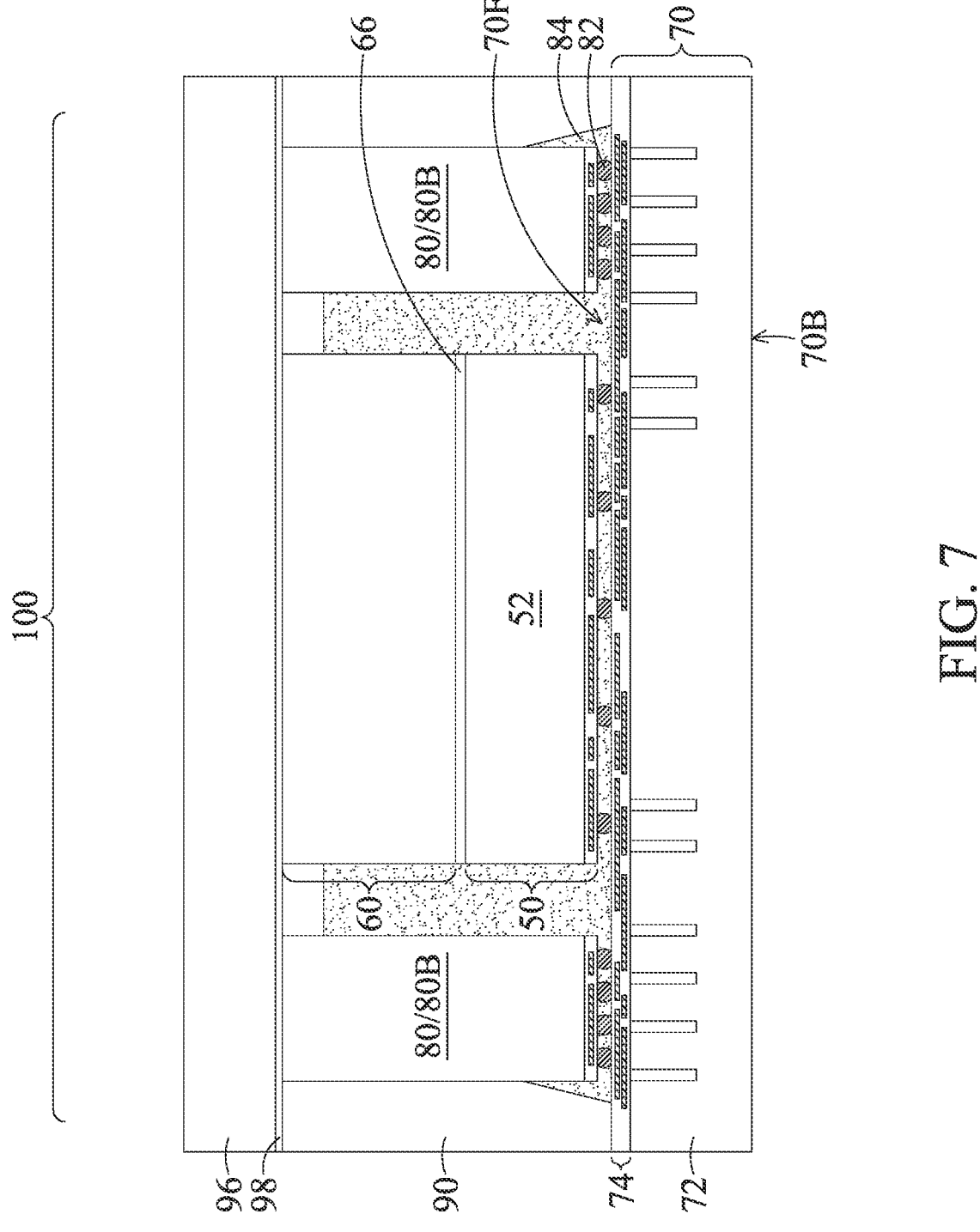

In FIG. 7, the intermediate structure may be placed on a carrier substrate 96 or other suitable support structure for subsequent processing. For example, the carrier substrate 96 may be attached to the first integrated circuit device 80A, the second integrated circuit devices 80B, and the encapsulant 90 by a release layer 98. In some embodiments, the carrier substrate 96 is a substrate such as a bulk semiconductor or a glass substrate having a wafer or panel shape or the like. The release layer 98 may be formed of a polymer-based material, which may be removed along with the carrier substrate 96 from the structure after processing. In some embodiments, the release layer 98 is an epoxy-based thermal-release material, which loses its adhesive property when heated, such as a light-to-heat-conversion (LTHC) release coating.

Figure 8:
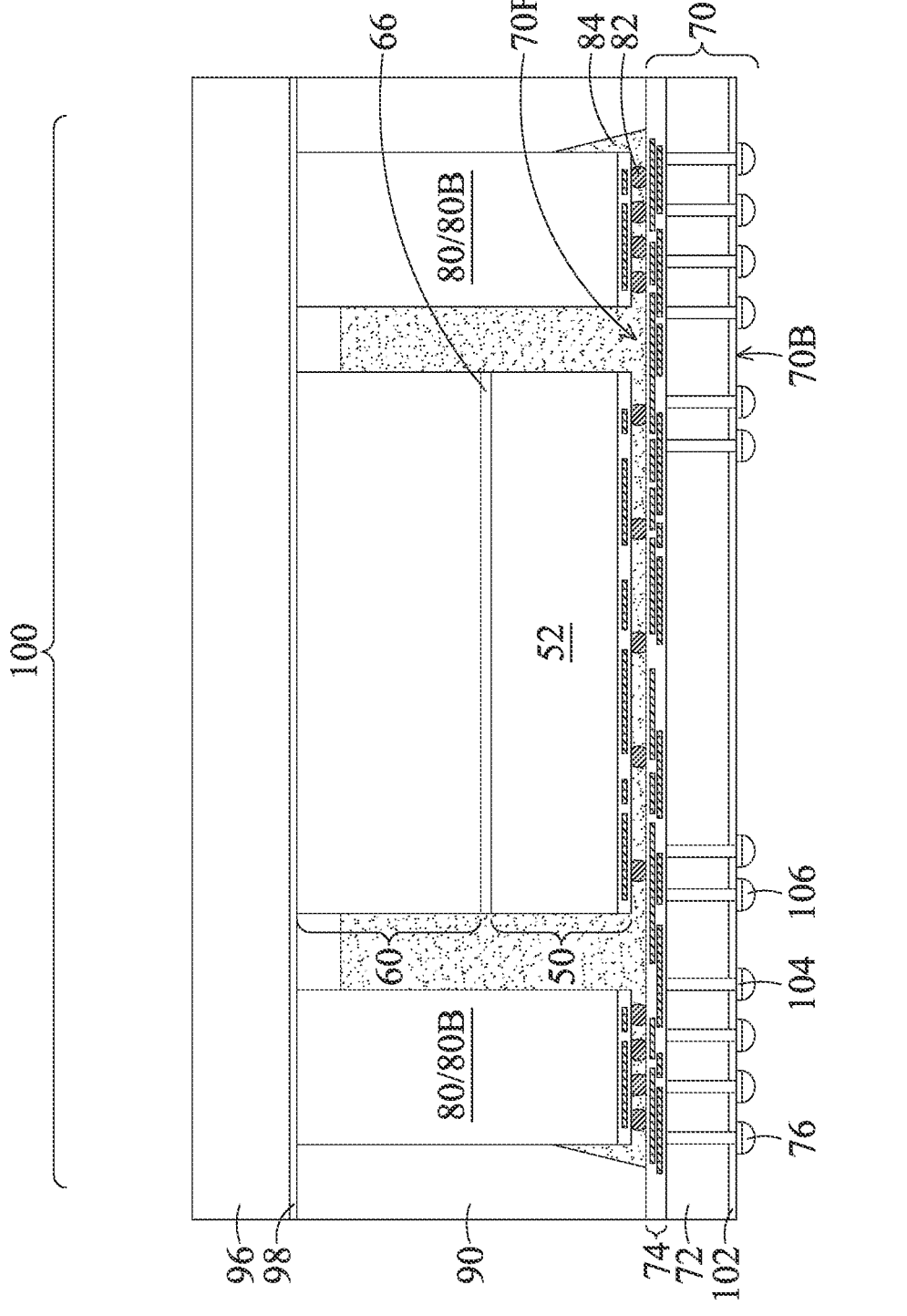

In FIG. 8, the interposer 70 is thinned to expose the through vias 76. Exposure of the through vias 76 may be accomplished by a thinning process, such as a grinding process, a chemical-mechanical polish (CMP), an etch-back, combinations thereof, or the like. In the illustrated embodiment, a recessing process is performed to recess the back surface of the substrate 72 such that the through vias 76 protrude at the back side 70B of the interposer 70. The recessing process may be, e.g., a suitable etch-back process, chemical-mechanical polish (CMP), or the like. In some embodiments, the thinning process for exposing the through vias 76 includes a CMP, and the through vias 76 protrude at the back side 70B of the interposer 70 as a result of dishing that occurs during the CMP or a separate recess etch process. An insulating layer 102 is optionally formed on the back surface of the substrate 72, surrounding the protruding portions of the through vias 76. In some embodiments, the insulating layer 102 is formed of a silicon-containing insulator, such as silicon nitride, silicon oxide, silicon oxynitride, or the like, and may be formed by a suitable deposition method such as spin coating, CVD, plasma-enhanced CVD (PECVD), high-density plasma CVD (HDP-CVD), or the like. Initially, the insulating layer 102 may bury the through vias 76. A removal process can be applied to the various layers to remove excess materials over the through vias 76. The removal process may be a planarization process such as a chemical mechanical polish (CMP), an etch-back, combinations thereof, or the like. After planarization, the exposed surfaces of the through vias 76 and the insulating layer 102 are coplanar (within process variations) and are exposed at the back side 70B of the interposer 70. In another embodiment, the insulating layer 102 is omitted, and the exposed surfaces of the substrate 72 and the through vias 76 are coplanar (within process variations).

Under bump metallurgies (UBMs) 104 may be formed on the exposed surfaces of the through vias 76 and the insulating layer 102 (or the substrate 72, when the insulating layer 102 is omitted). As an example to form the UBMs 104, a seed layer (not separately illustrated) is formed over the exposed surfaces of the through vias 76 and the insulating layer 102 (if present) or the substrate 72. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 104. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 104.

Further, conductive connectors 106 are formed on the UBMs 104. The conductive connectors 106 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 106 may be formed of a conductive material that is reflowable, such as solder, copper, aluminum, gold, nickel, silver, palladium, tin, the like, or a combination thereof. In some embodiments, the conductive connectors 106 are formed by initially forming a layer of solder through evaporation, electroplating, printing, solder transfer, ball placement, or the like. Once a layer of solder has been formed on the structure, a reflow may be performed in order to shape the material into desired bump shapes. In some embodiments, the conductive connectors 106 comprise metal pillars (such as copper pillars) formed by sputtering, printing, electroplating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In FIG. 9, the intermediate structure is placed on a carrier substrate 120 or other suitable support structure for subsequent processing. For example, the carrier substrate 120 may be attached to the conductive connectors 106 and a back side 70B of the interposer 70 by a release layer 122. For example, the release layer 122 may have a thickness greater than the conductive connectors 106 for avoiding the conductive connectors 106 from touching the carrier substrate 120, which may reduce damage to the conductive connectors 106. The release layer 122 may have a similar material as the release layer 98, such as a thermal-release material, which may lose its adhesive property when heated, such as LTHC release coating. In some embodiments, the carrier substrate 120 is a bulk semiconductor substrate or a glass substrate having a wafer or panel shape or the like.

A, a carrier debonding process is performed to detach (debond) the carrier substrate 96 (see FIG. 12) from the first integrated circuit device 80A, the second integrated circuit devices 80B, and the encapsulant 90. The debonding includes projecting a light such as a laser light or an ultraviolet (UV) light from a top side of the carrier substrate 96 for heating the release layer 98 locally. Accordingly, the release layer 98 may be decomposed under the locally distributed heat of the light, and the carrier substrate 96 can be removed, while the release layer 122 on the back side 70B of the interposer 70 may not be affected.

In the subsequent processes, a second heat dissipation structure 130 will be formed over the top surfaces of the encapsulant 90. A cooling fluid (such as water, fluorocarbons, or other suitable coolants) may flow through the second heat dissipation structure 130 for dissipating heat from the integrated circuit devices 80. For example, the second heat dissipation structure 130 may take the advantage of latent heat of the cooling fluid to dissipate heat, but the evaporated gas of the cooling fluid may also form a boiling vapor film or bubbles over the surface of the second heat dissipation structure 130. The boiling vapor film or bubbles may be a dry area that may obstruct the cooling fluid from contacting the surface of the second heat dissipation structure 130, and thus may limit the heat dissipation capacity and efficiency of the second heat dissipation structure 130.

In some embodiments, the second heat dissipation structure 130 may include a heat spreading layer 134 and pillars 140. The heat spreading layer 134 and the pillars 140 may help increase the surface area of the second heat dissipation structure 130 and may decrease the impact of the dry area, thereby improving the heat dissipation capacity and efficiency of the second heat dissipation structure 130. In some embodiments, the second heat dissipation structure 130 also includes forming nanostructures 164 (see FIG. 15) over the pillars 140. The nanostructures 164 may help increase the wicking rate of the surface of the second heat dissipation structure 130 in or under the dry area. For example, the cooling liquid may continuously flow through the nanostructures 164 of the second heat dissipation structure 130 in or under the dry area from the adjacent nanostructures 164 and porous pillars 240 in the wet area by capillary action, although the cooling fluid convection may be blocked by the boiling vapor film. As such, heat generated by the integrated circuit package 100 may be effectively dissipated through the second heat dissipation structure 130 and the cooling fluid, thereby allowing the integrated circuit package 100 to implement and operate high-performance integrated circuit devices, such as the integrated circuit device 80.

Figure 10:
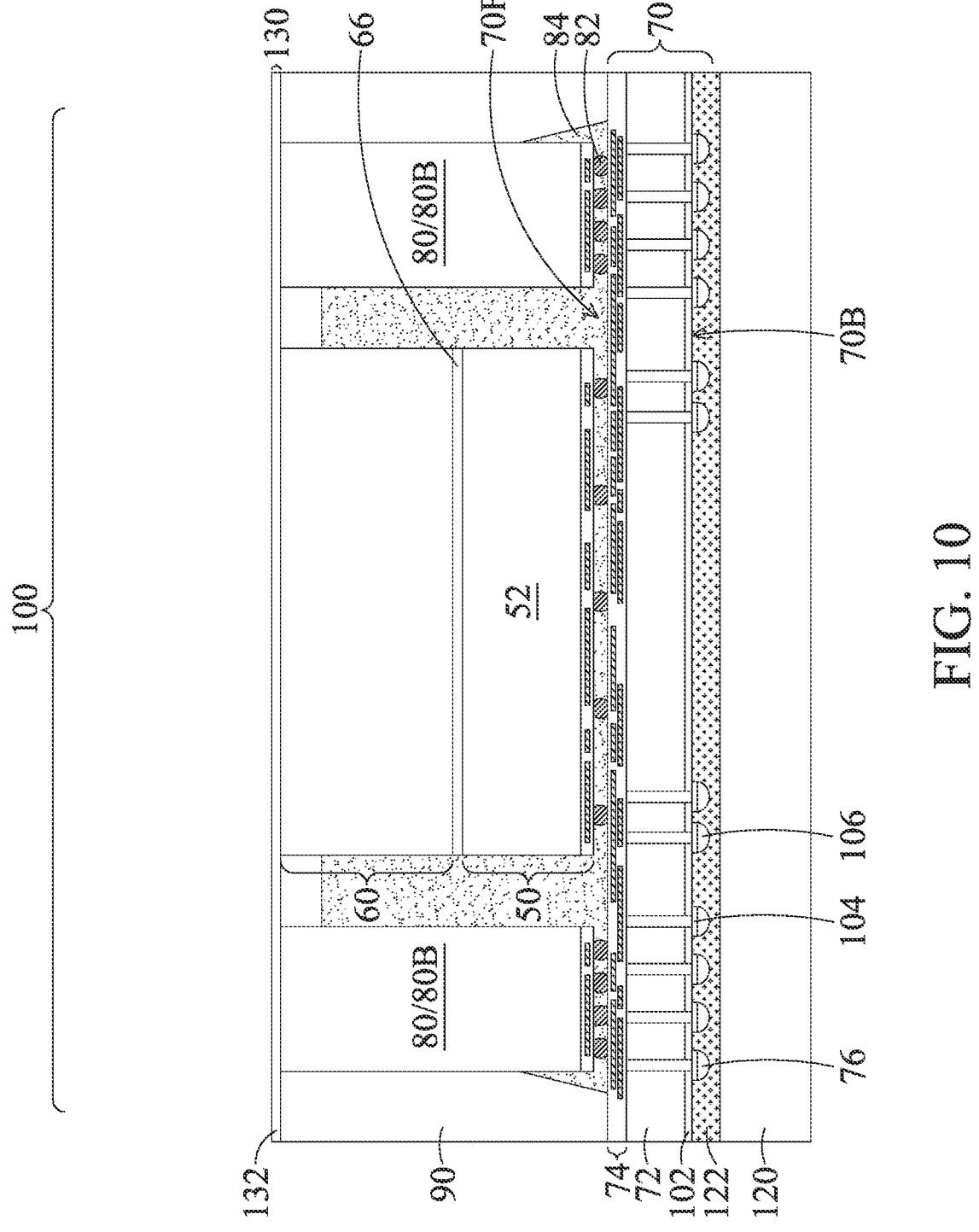

In FIG. 10, a metal layer 132 of the second heat dissipation structure 130 is formed over the top surfaces of the encapsulant 90, the first heat dissipation structure 60 of the first integrated circuit device 80A, and the second integrated circuit devices 80B, in accordance with some embodiments. In some embodiments, the metal layer 132 is in physical contact with the encapsulant 90, the first heat dissipation structure 60 of the first integrated circuit device 80A, and the second integrated circuit devices 80B. The metal layer 132 may be a single layer or a composite layer comprising a plurality of sub-layers formed of different materials. In some embodiments, the metal layer 132 includes a Ti layer and a Cu layer over the Ti layer. In some embodiments, the metal layer 132 is a layer of Cu-containing alloy, such as TiNiCu, AlNiVCu, a combination thereof, or the like. In the subsequent processes, the metal layer 132 may act as a seed layer for aiding overlying layers to be plated over the first integrated circuit device 80A, the second integrated circuit devices 80B, and the encapsulant 90. The metal layer 132 may be formed by PVD, CVD, ALD, or other suitable deposition methods. In some embodiments, the metal layer 132 has a thickness of 0.1 um to 1 um.

Figure 11A:
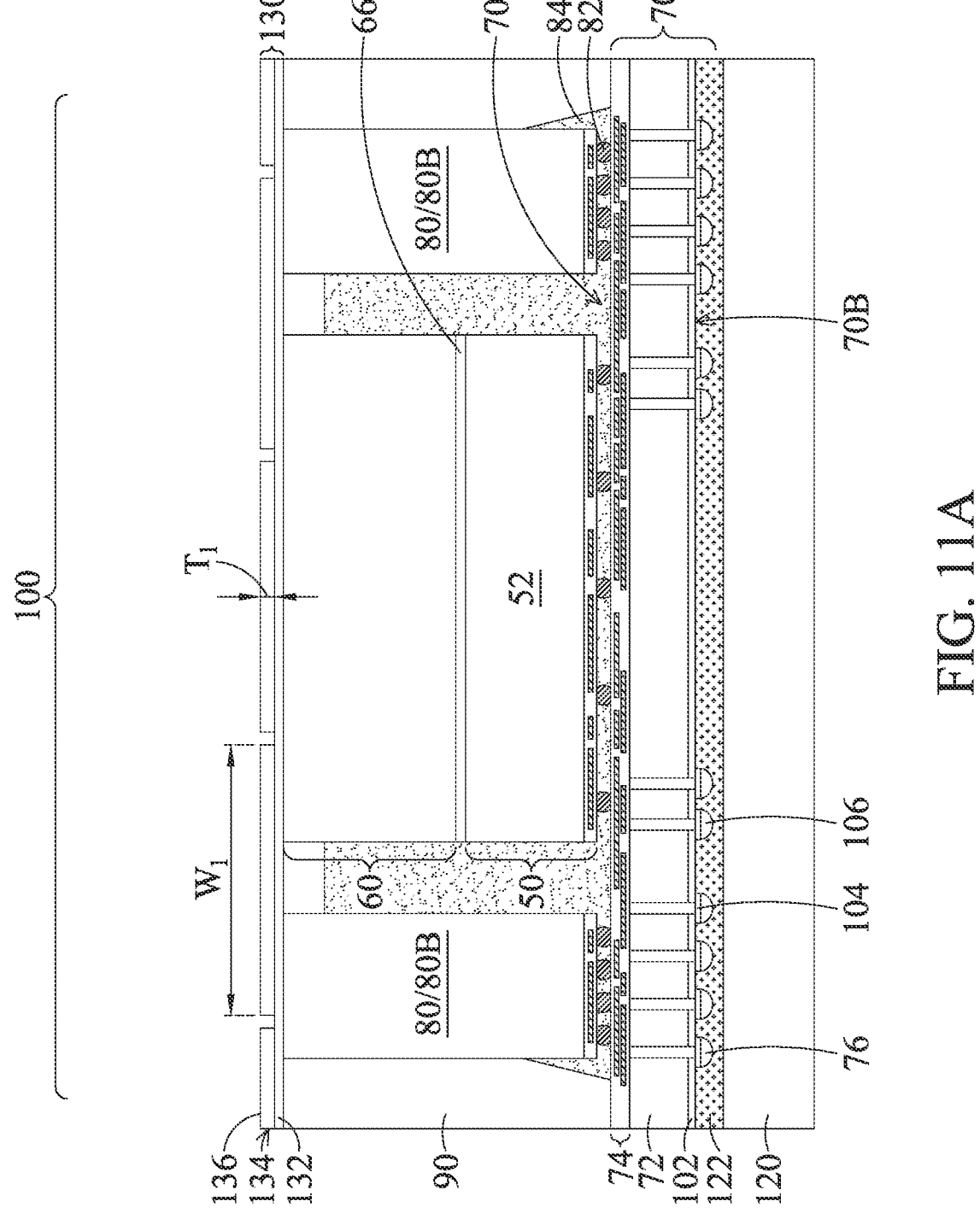
Figure 11B:
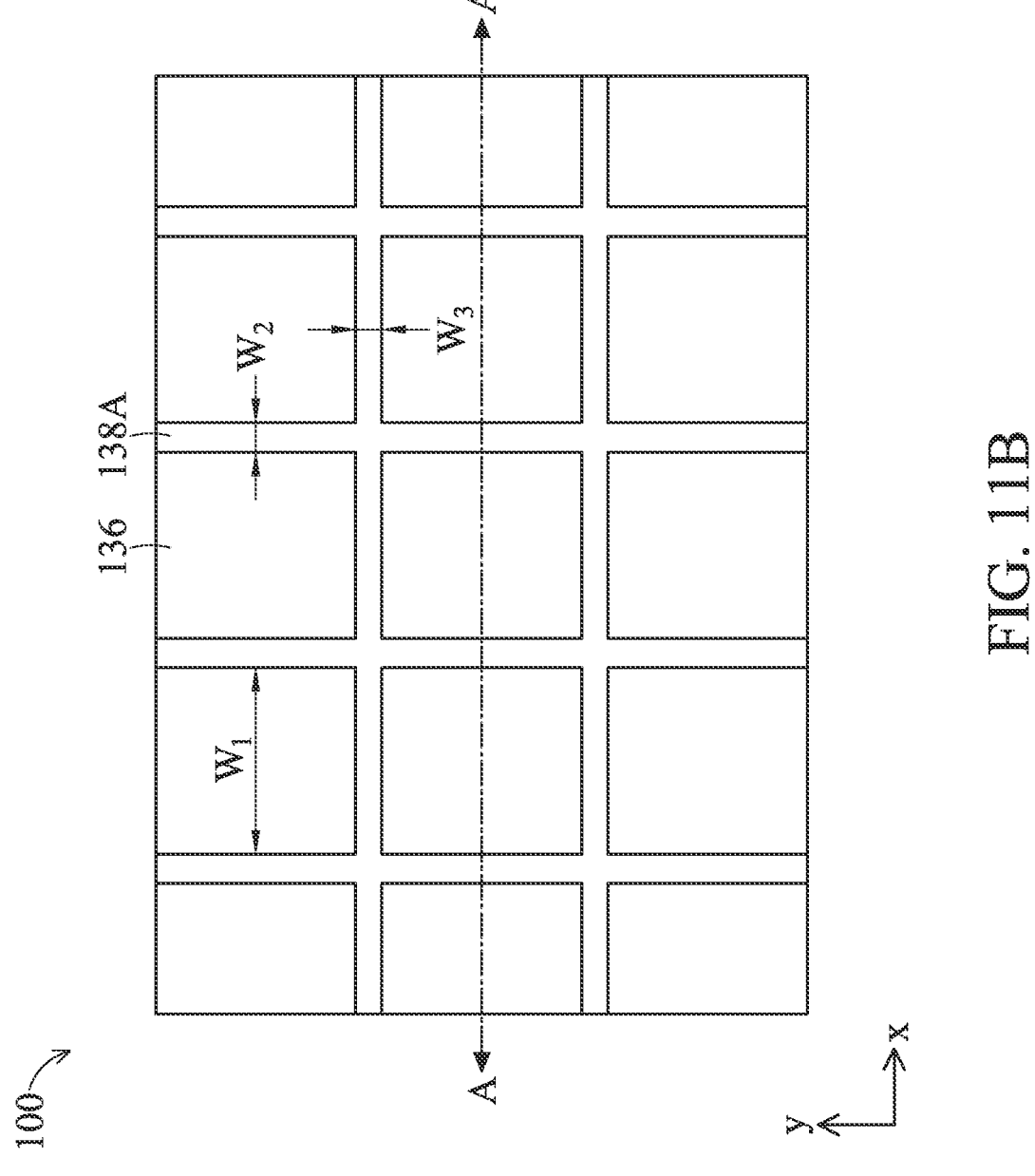
FIGS. 11B to 11D and 12B to 12D are plan views of intermediate stages in the manufacturing of an integrated circuit device, in accordance with some embodiments.

In FIGS. 11A and 11B, a heat spreading layer 134 formed over the metal layer 132, in accordance with some embodiments, wherein FIG. 11B is a top view of the integrated circuit package 100 at the intermediate stage, and FIG. 11A is a cross-sectional view taken along the section A-A as illustrated in FIG. 11B. As illustrated in FIG. 11A, the heat spreading layer 134 may include a plurality of islands 136. The width $W_1$ of the islands 136 (e.g., in the x-direction of FIG. 11B) is greater than a thickness $T_1$ of the islands 136. The width $W_1$ may be in a range from 10 um to 500 um, and the thickness $T_1$ may be in a range from 3 um to 50 um. As illustrated in FIG. 11B, the islands 136 may be arranged as straight lines, such as lines extending along the x-direction of FIG. 11B. A groove 136A may be between the adjacent lines of the islands 136 in the x-direction of FIG. 11B. The groove 136A may have a width $W_2$ ranging from 1 um to 100 um in the x-direction. A groove 136B may be between the adjacent islands 136 in the y-direction of FIG. 11B. The groove 136B may have a width $W_3$ ranging from 1 um to 100 um in the y-direction. The islands 136 may have a rectangular, rounded rectangular, square, rounded square, circular, or an oval shape, combinations thereof, or the like in a plan view. The heat spreading layer 134 may include aluminum, copper, nickel, cobalt, silver, titanium, iron, an alloy thereof, or a combination thereof, or other materials, such as silicon carbide, aluminum nitride, other suitable metals, and the like.

Figure 11C:
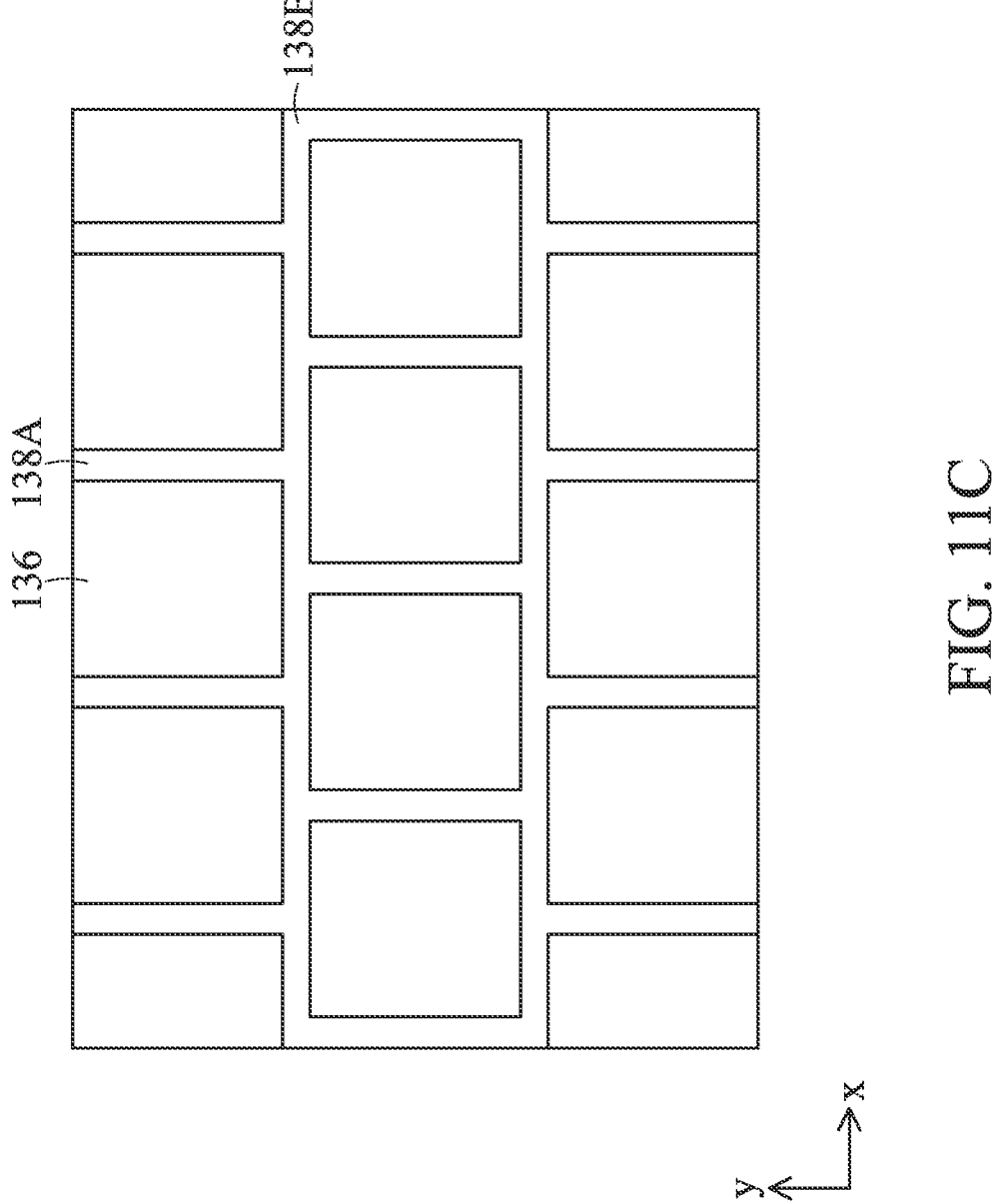
Figure 11D:
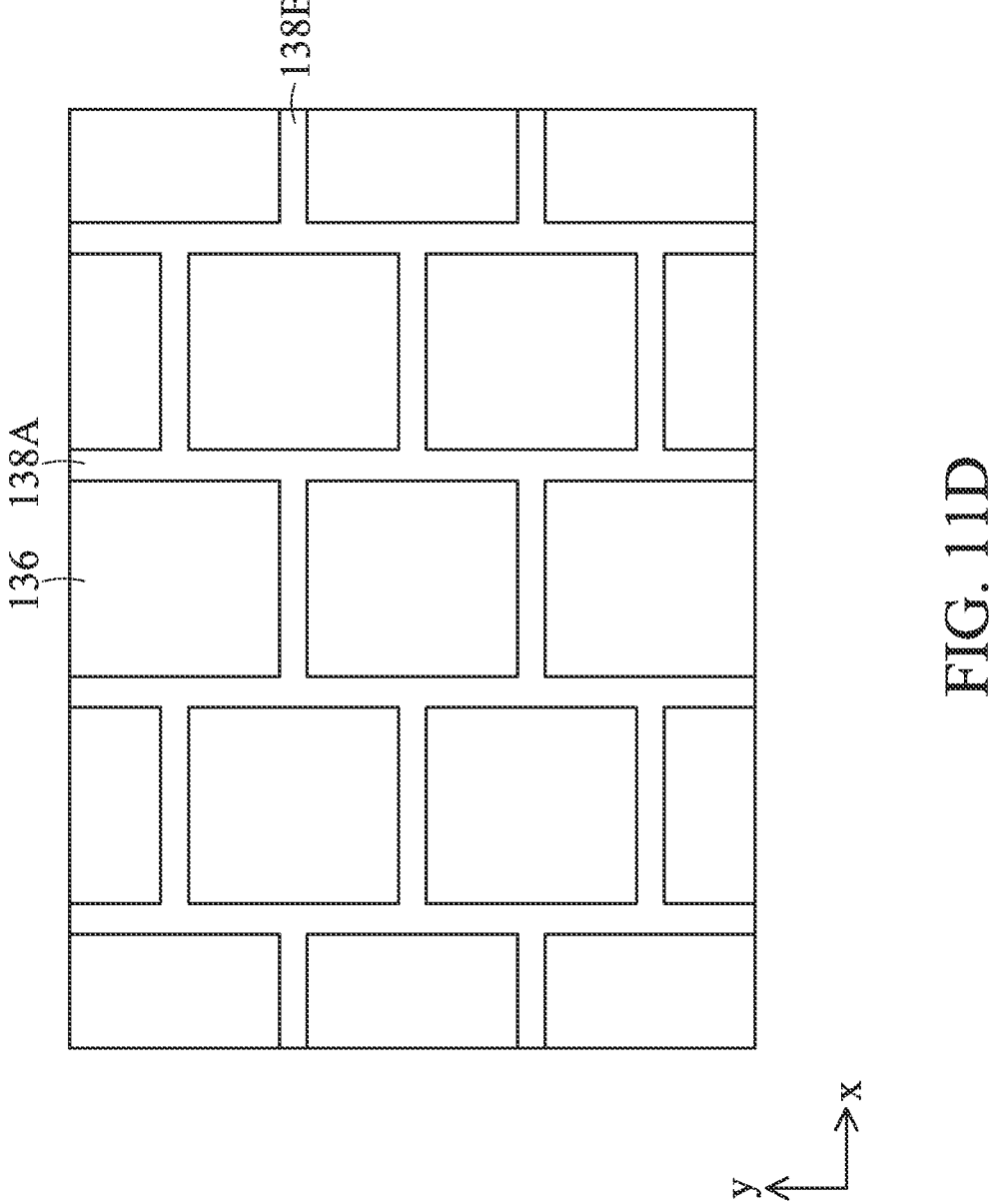

Although FIG. 11B only shows the islands 136 being arranged as straight lines extending in the x-direction and y-direction, other patterns of islands 136 may be implemented or used. For example, the islands 136 may be partially or completely staggered in either the x-direction (as shown in FIG. 11C) or the y-direction (as shown in FIG. 11D). In some embodiments, the heat spreading layer 134 helps increase the surface areas of the second heat dissipation structure 130 for dissipating heat, such as increasing the area that is able to contact the cooling fluid for evaporating or exchanging heat with the cooling fluid, as well as reducing the impact that a dry area may be formed over the second heat dissipation structure 130. In some embodiments, the heat spreading layer 134 occupies 10% to 90% of the top surface of the metal layer 132 (e.g., the total top surface areas of the first integrated circuit devices 80A, the second integrated circuit devices 80B, and the encapsulant 90.)

The heat spreading layer 134 is formed by electroplating, electroless plating or other suitable deposition methods, such as PVD or CVD, in accordance with some embodiments. For example, a photoresist layer is formed over the metal layer 132 and patterned to have openings at locations corresponding to the islands 136. Next, the heat spreading layer 134 is formed in the openings of the photoresist layer. In some embodiments that the heat spreading layer 134 is formed by the electroplating or the electroless plating, the metal layer 132 may function as a seed layer. The photoresist layer may then be removed, such as by lifting or ashing.

Figure 12A:
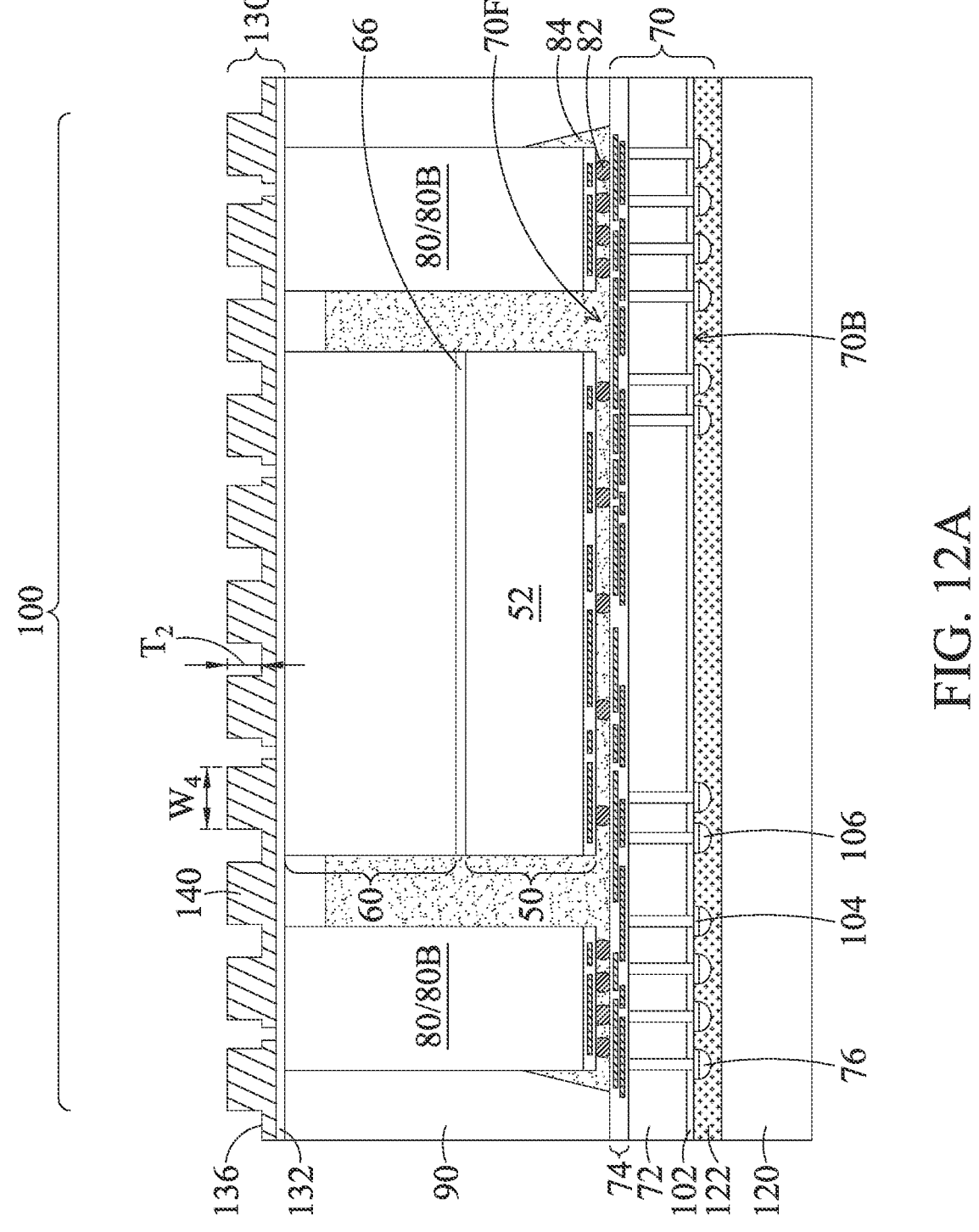
Figure 12B:
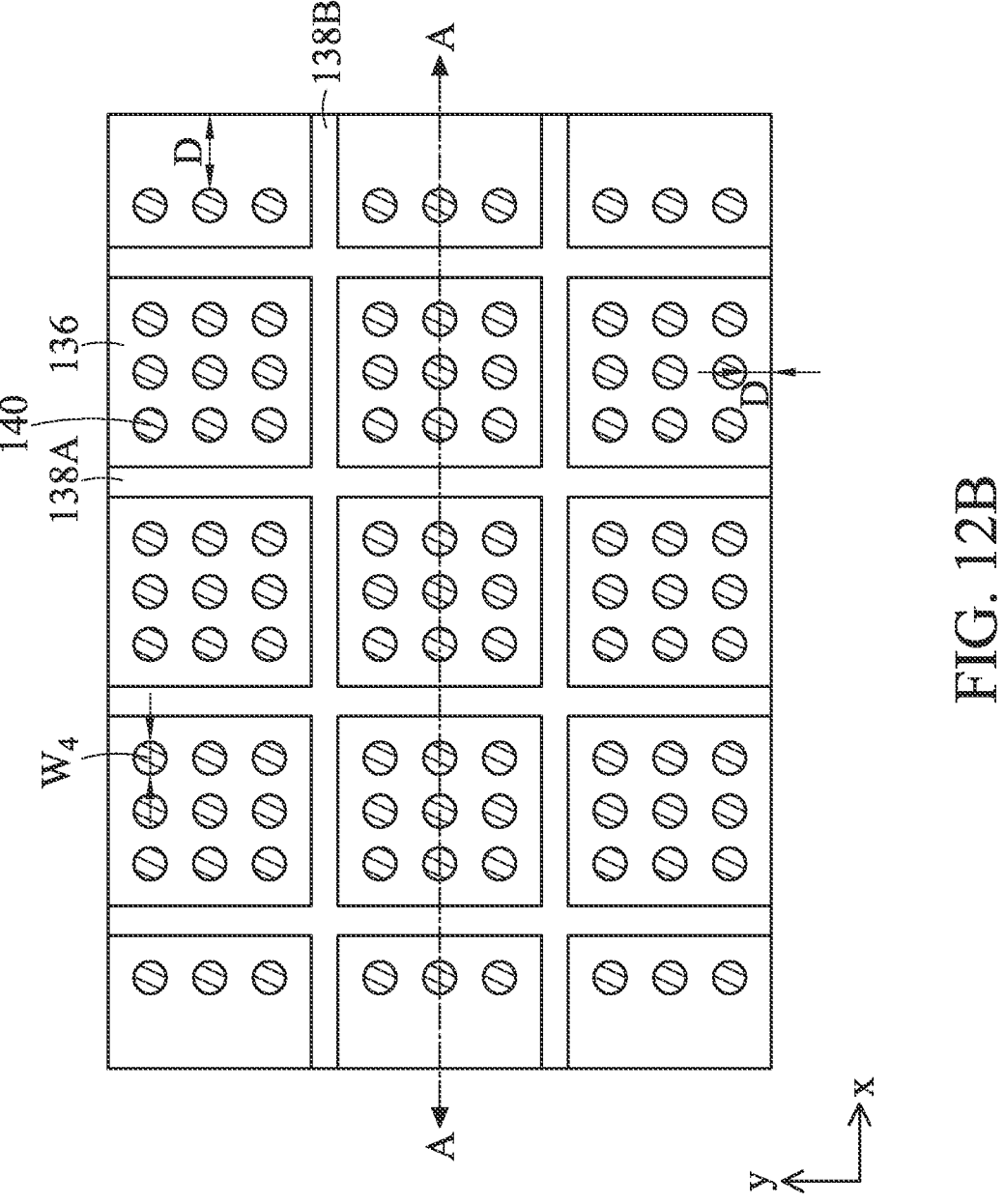
Figure 12C:
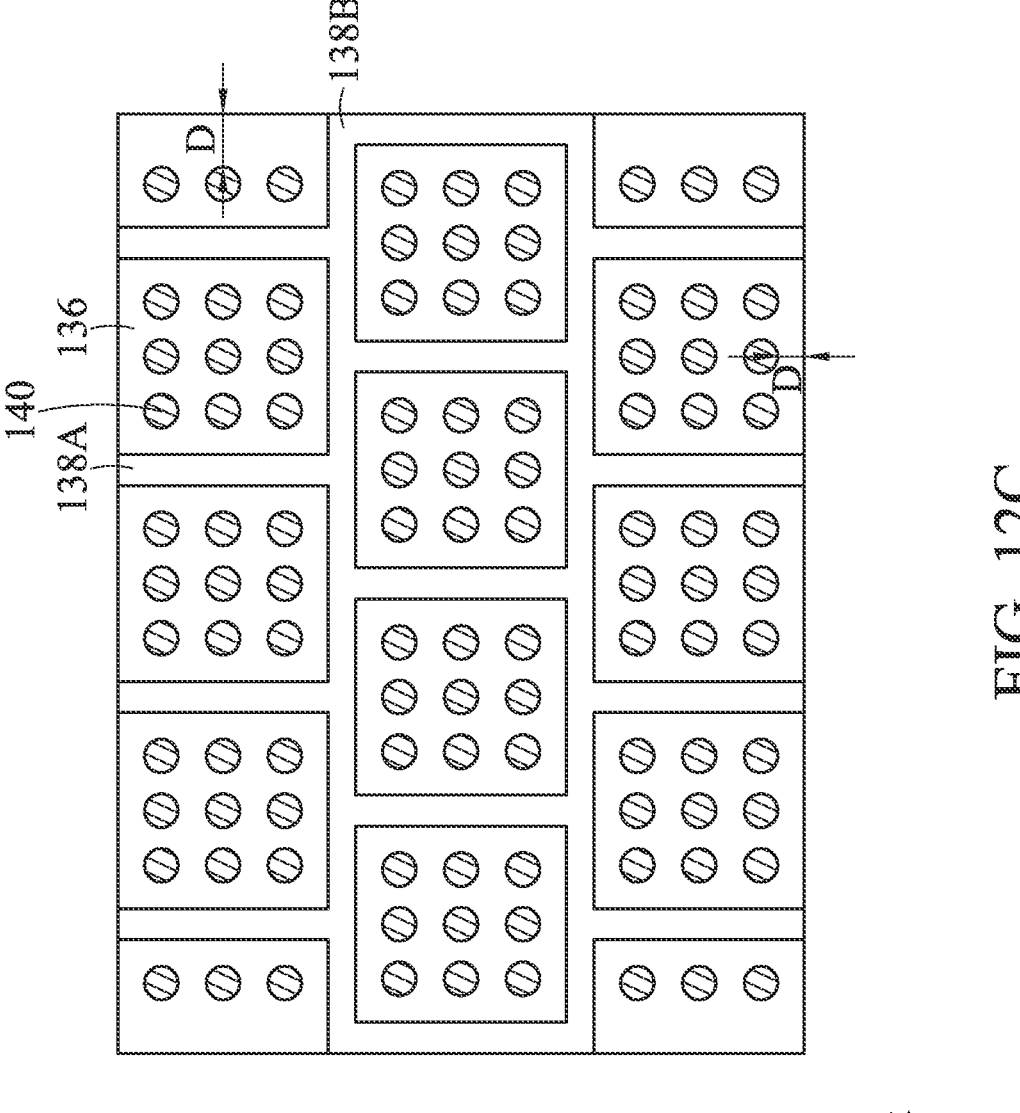
Figure 12D:
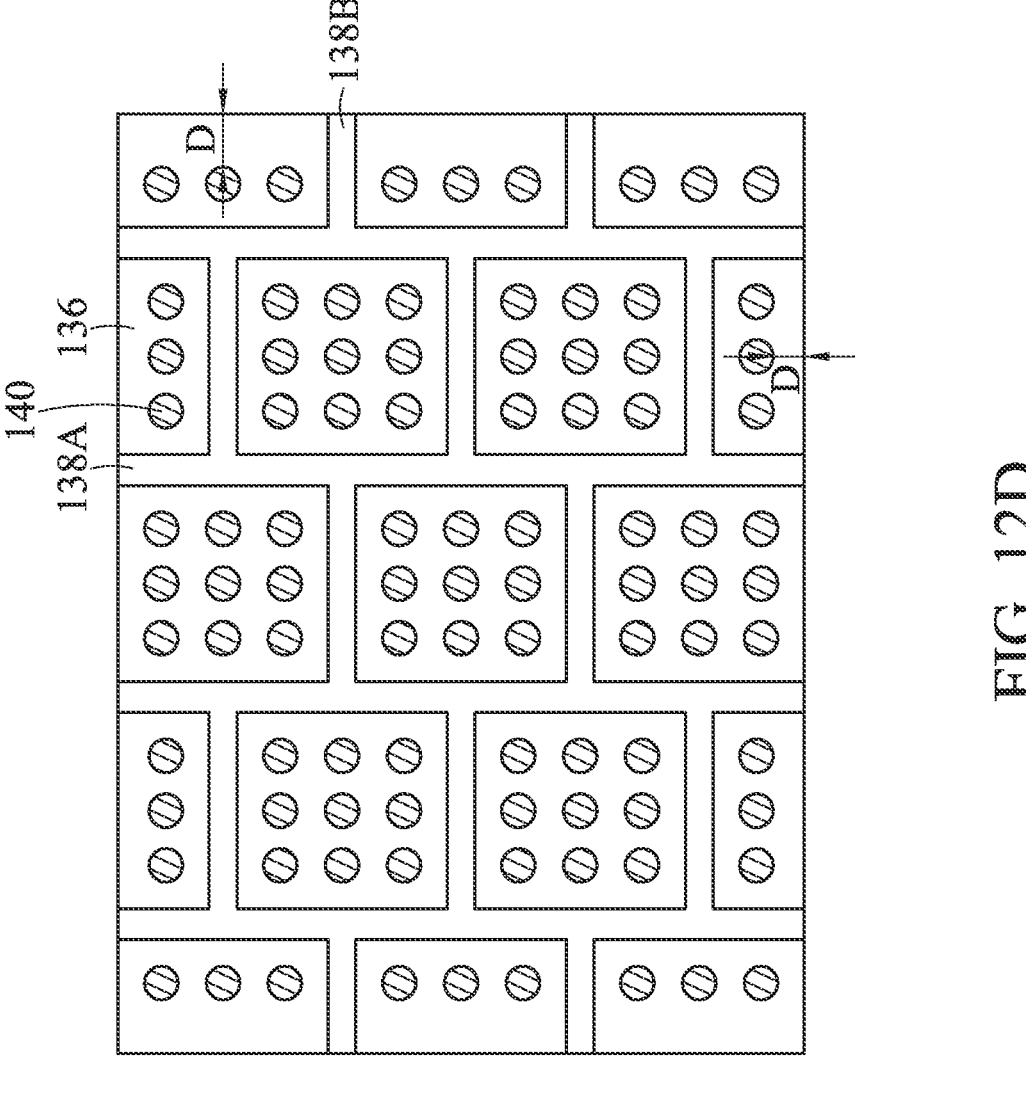

In FIGS. 12A and 12B, pillars 140 of the second heat dissipation structure 130 are formed over the heat spreading layer 134, in accordance with some embodiments, wherein FIG. 12B is a top view of the integrated circuit package 100 at the intermediate stage, and FIG. 12A is a cross-sectional view taken along the section A-A as illustrated in FIG. 12B. The pillars 140 may have a thickness $T_2$ ranging from 30 um to 50 um, such as ranging from 32 um to 40 um. The pillars 140 may have a width $W_4$ (or diameter) ranging from 20 um to 100 um. The pillars 140 may have a circular, oval, rectangular, rounded rectangular, square, or rounded square shape, combinations thereof, or the like in a plan view. Although FIG. 12B only shows three or nine pillars 140 formed over one island 136 of the heat spreading layer 134, more or less of the pillars 140 may be formed over one island 136. In some embodiments that the heat spreading layer 134 has a pattern as illustrated in FIGS. 11C and 11D, the pillars 140 are formed over the islands 136, and top views of the resulting structures are illustrated in FIGS. 12C and 12D, respectively. The pillars 140 may include as aluminum, copper, nickel, cobalt, silver, titanium, iron, an alloy thereof, or a combination thereof, or other materials, such as silicon carbide, aluminum nitride, other suitable metals, and the like.

In some embodiments, the pillars 140 may help increase the surface areas of the second heat dissipation structure 130 for dissipating heat, such as increasing the area that is able to contact the cooling fluid for evaporating or exchanging heat with the cooling fluid, as well as reducing the impact that a dry area may be formed over the second heat dissipation structure 130.

In some embodiments, the pillars 140 occupy 40% to 60%, or around 50%, of the top surface of the metal layer 132 (e.g., the total top surface areas of the first integrated circuit devices 80A, the second integrated circuit devices 80B, and the encapsulant 90.) In some embodiments, the outermost one of the pillars 140 may have a distance D to the edge of the encapsulant 90. In some embodiments, the distance D is in a range from 50 um to 500 um. The distance D may ensure the assembly quality of the integrated circuit package 100.

Figure 13:
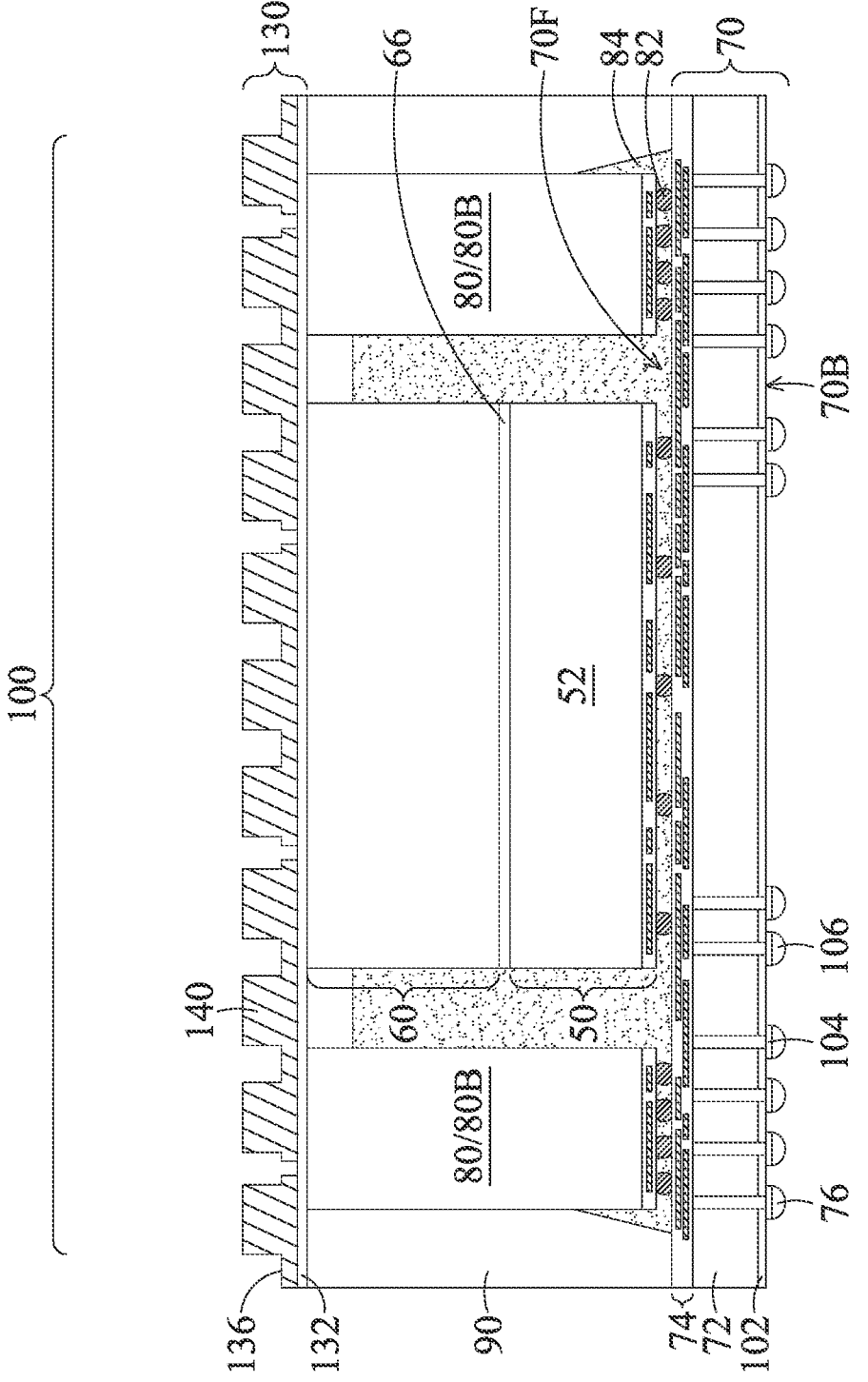

In FIG. 13, a carrier debonding is performed to detach (debond) the carrier substrate 120 (see FIG. 12A) from the back side 70B of the interposer 70. The debonding includes projecting a light such as a laser light or a UV light for heating the release layer 122. Accordingly, the release layer 122 may be decomposed under the heat of the light, and the carrier substrate 120 can be removed.

The processes discussed above may be performed at the wafer level, wherein the interposer 70 is wafer sized, and a singulation process is performed. For example, the intermediate structure may be placed on a tape (not shown), and a singulation process is performed by cutting along scribe line regions to form the structure as illustrated in FIG. 13. The singulation process may include sawing, dicing, or the like. For example, the singulation process can include sawing the insulating layer 102, the encapsulant 90, the interconnect structure 74, and the substrate 72. The singulation process singulates the wafer-sized interposer 70 into separate packages. As a result of the singulation process, the outer sidewalls of the interposer 70 and the encapsulant 90 are laterally coterminous (within process variations).

Figure 14:
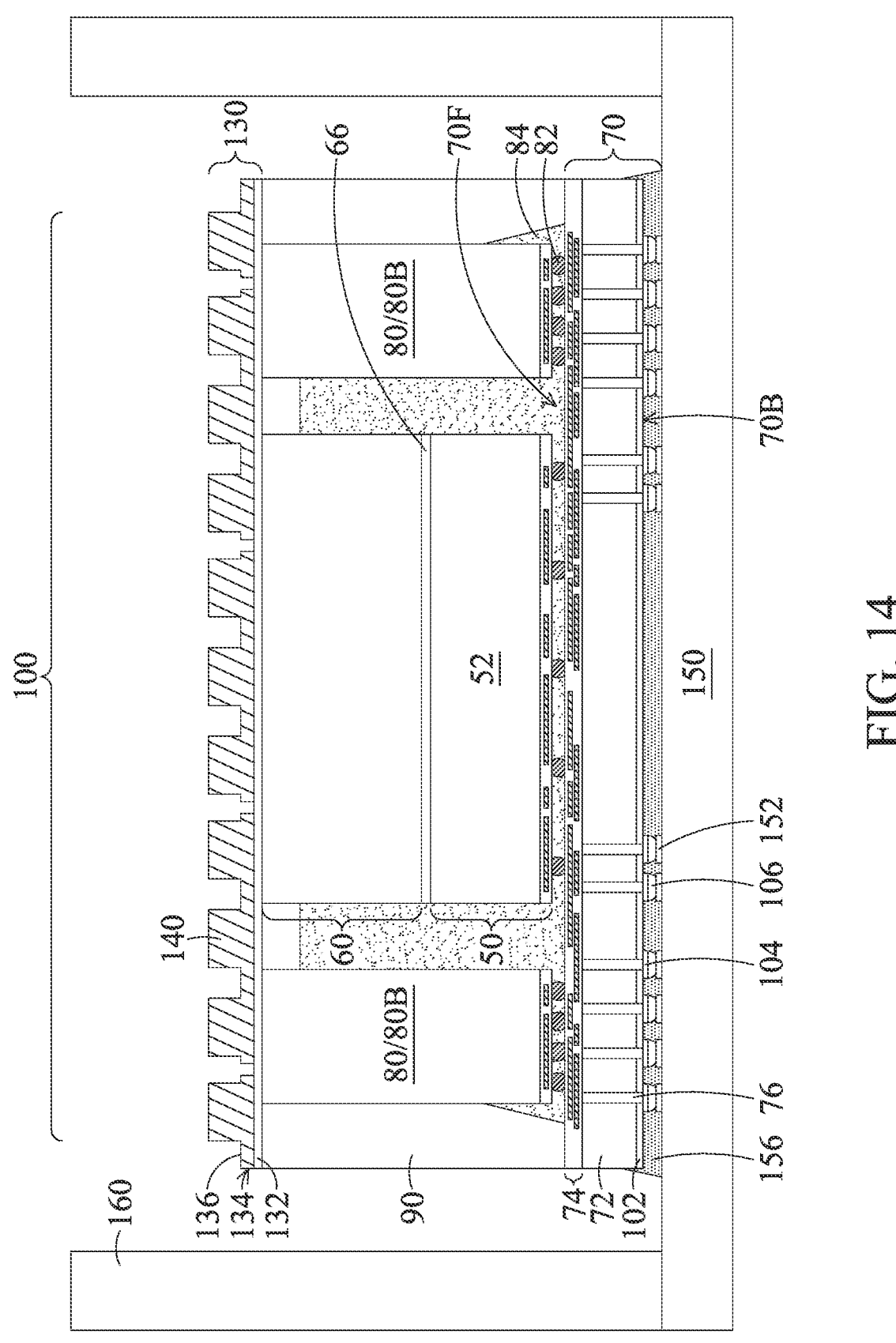

In FIG. 14, one or more of the singulated packages obtained in FIG. 13 is attached to a substrate 150 using the conductive connectors 106. The substrate 150 may be an interposer, a core substrate, a coreless substrate, a printed circuit board (PCB), a package substrate, or the like. The substrate 150 may include active and/or passive devices (not separately illustrated). Devices such as transistors, capacitors, resistors, combinations thereof, and the like may be used to generate the structural and functional requirements of the design for the system. The devices may be formed using any suitable methods.

The substrate 150 may also include metallization layers and vias (not separately illustrated) and bond pads 152 over the metallization layers and vias. The conductive connectors 106 may comprise solder reflowed to attach the UBMs 104 to the bond pads 152. The conductive connectors 106 electrically connect the metallization layers of the interconnect structure 74 of the interposer 70 to the substrate 150, including metallization layers in the substrate 150. Thus, the substrate 150 is electrically connected to the integrated circuit devices 80. In some embodiments, passive devices (e.g., surface mount devices (SMDs), not separately illustrated) may be attached to the back side 70B of the interposer 70 (e.g., bonded to the UBMs 104) prior to mounting on the substrate 150. In such embodiments, the passive devices may be bonded to a same surface of the substrate 150 as the conductive connectors 106.

In some embodiments, an underfill 156 is formed between the interposer 70 and the substrate 150, surrounding the conductive connectors 106 and the UBMs 104. The underfill 156 may be formed by a capillary flow process after substrate 150 is attached or may be formed by a suitable deposition method before the substrate 150 is attached. The underfill 156 may be a continuous material extending from the substrate 150 to the interposer 70 (e.g., the insulating layer 102).

A ring structure 160 is attached to the substrate 150, in accordance with some embodiments. The ring structure 160 may laterally surround the integrated circuit devices 80 and the encapsulant 90. The ring structure 160 may be attached to the substrate 150 using an adhesive or a screw. The ring structure 160 may be a metal or metal alloy, such as aluminum, copper, nickel, cobalt, silver, titanium, iron, an alloy thereof, or a combination thereof, or other materials, such as silicon carbide, aluminum nitride, graphite, other suitable metals, and the like. The ring structure 160 may provide a mechanical force to reduce the warpage of the integrated circuit package 100 and also provide a path for dissipating the heat generated from the integrated circuit package 100 away. In some embodiments, the ring structure 160 may have a height of 500 um to 3000 um. As such, the top surface of the ring structure 160 may have a distance of 300 um to 2500 um to the top surface of the pillars 140.

Figure 15:
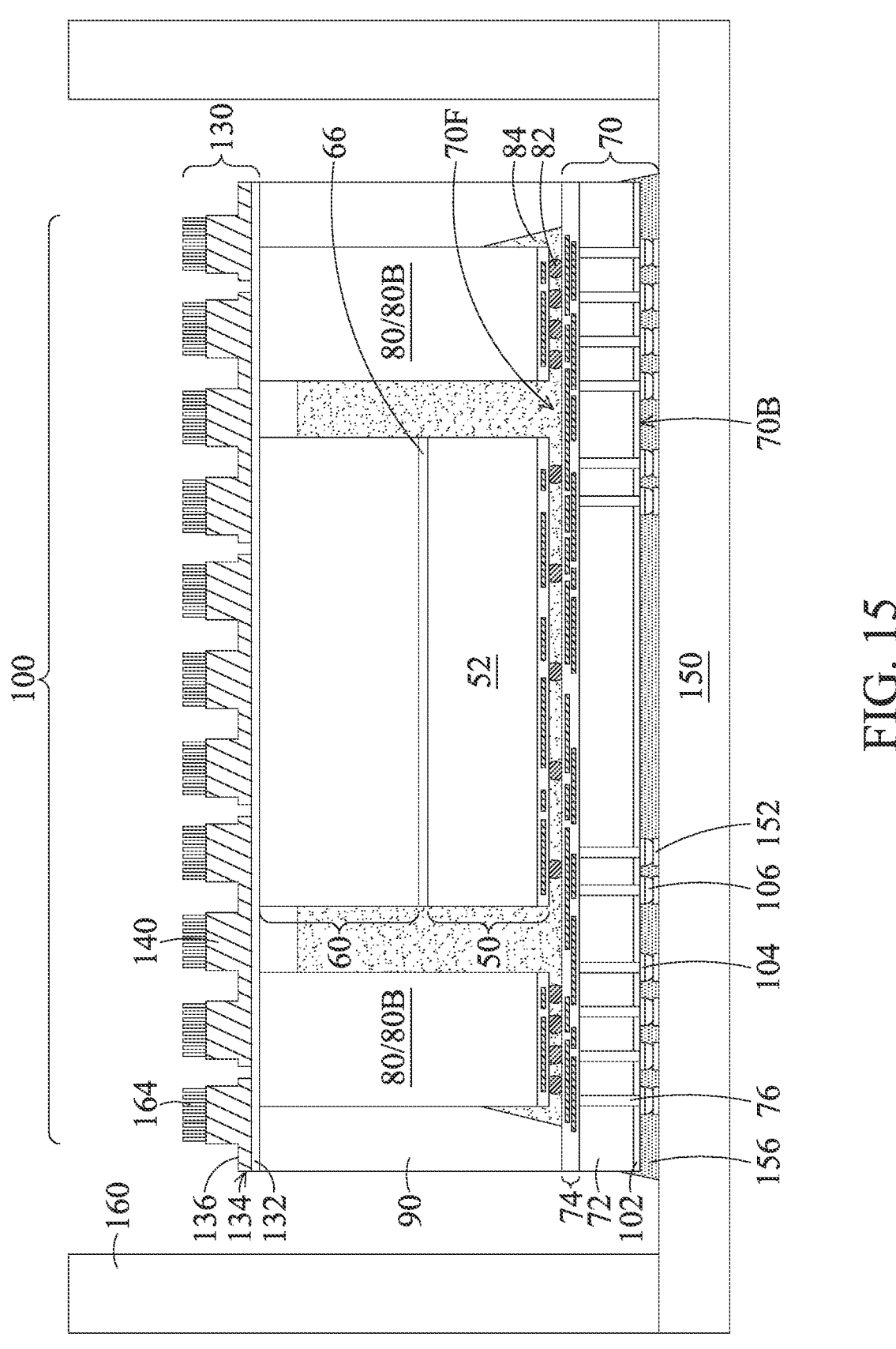
Figure 16:
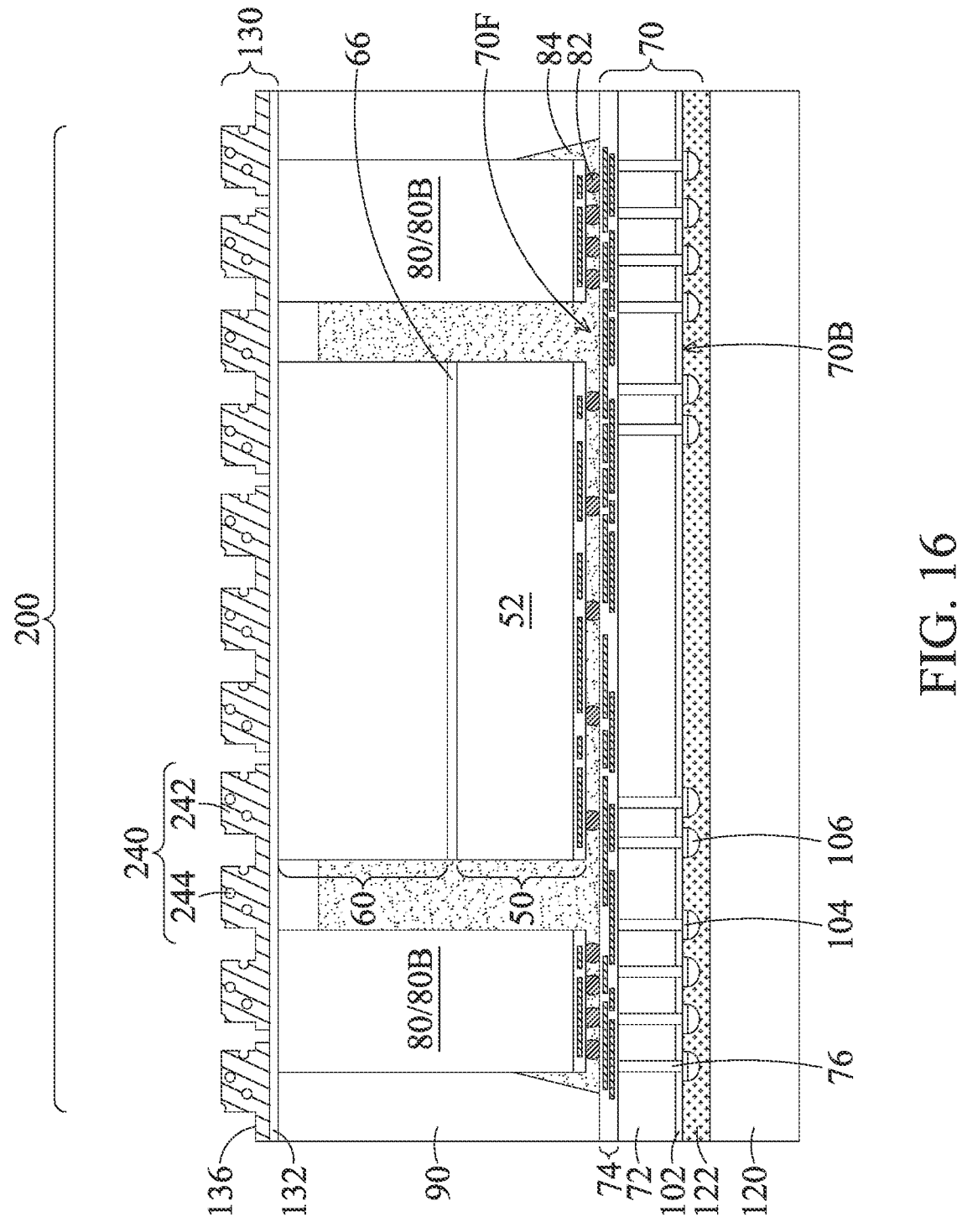
FIGS. 16 to 18 are cross-sectional views of intermediate stages in the manufacturing of an integrated circuit package, in accordance with some embodiments.

In FIG. 15, nanostructures 164 of the second heat dissipation structure 130 are formed over the pillars 140, in accordance with some embodiments. The nanostructures 164 may be nanowires, nanotubes, or other suitable nanostructures) may include Cu, CuO, Ni, other suitable metals or alloys, or a combination thereof. In some embodiments, the nanostructures 164 have a material same as the pillars 140 and the heat spreading layer 134, such as copper or copper alloy, though the nanostructures 164 may have materials different from the pillars 140 or the heat spreading layer 134. In some embodiments, the nanostructures 164 include independent nanowires erected over the pillars 140 with channels between the nanowires, as illustrated in FIG. 16. In some embodiments, the nanostructures 164 include a net-like structure (not shown), and channels, such as connected or independent pores or tunnels, are within the net-like structure. The nanostructures 164 may have an average width $W_5$ of 1 nm to 10 nm. The nanostructures 164 may have an average height of 10 nm to 100 nm. In some embodiments in which the nanostructures 164 are nanowires, the nanostructures 164 have a circular, oval, square, rounded square, rectangular, rounded-rectangular shape, or any other suitable shapes in a plan view. In some embodiments, nanostructures 164 of the second heat dissipation structure 130 may be formed before the ring structure 160 is attached to the substrate 150, or before the singulated packages is attached to a substrate 150.

The nanostructures 164 may be formed by any suitable deposition methods, such as electroplating, electroless plating, CVD, PVD, a combination thereof, or the like. For example, a mask layer such as a photoresist layer, is deposited over the pillars 140, the heat spreading layer 134, and the metal layer 132. The photoresist layer may be patterned to have openings corresponding to the nanostructures 164 over the pillars 140 while covering the remaining portions of the pillars 140, the heat spreading layer 134, and the metal layer 132. The mask layer may then be removed, such as by lifting or ashing.

In some embodiments, the second heat dissipation structure 130 is formed over the first integrated circuit device 80A and the second integrated circuit devices 80B. The second heat dissipation structure 130 includes macrostructures such as the heat spreading layer 134 and the pillars 140 for increasing the surface areas of the second heat dissipation structure 130 for contacting the cooling fluid. The second heat dissipation structure 130 also includes microstructures such as the nanostructures 164 for reinstating the cooling fluid into the microstructures by the capillary action, thereby helping increase the wicking rate of the surfaces of the second heat dissipation structure 130. Thus, the heat dissipation capacity and efficiency of the integrated circuit package 100 may be improved. In some embodiments, the integrated circuit package 100 may have a thermal conductivity of over 250 W/cm².

Figure 17:
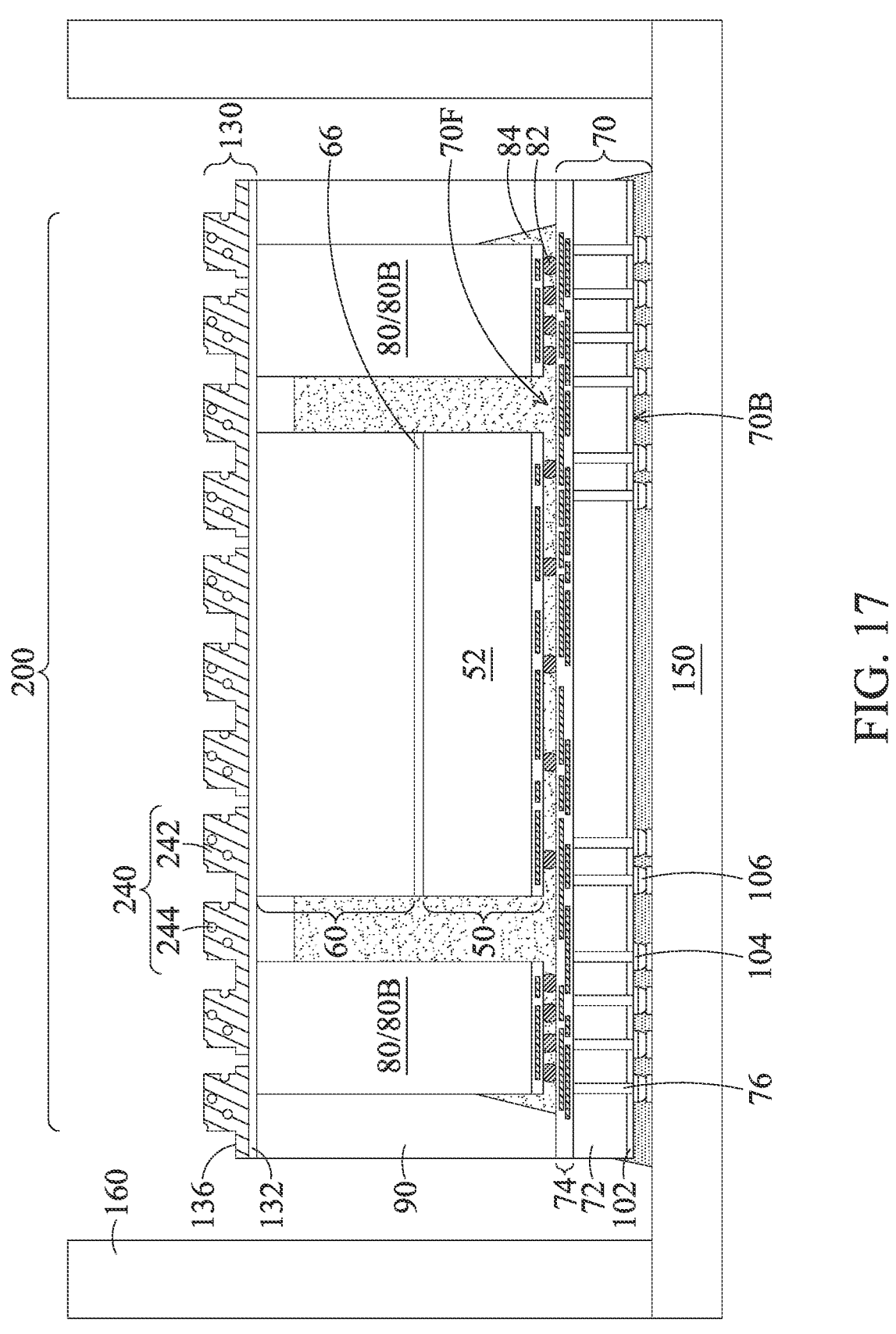
Figure 18:
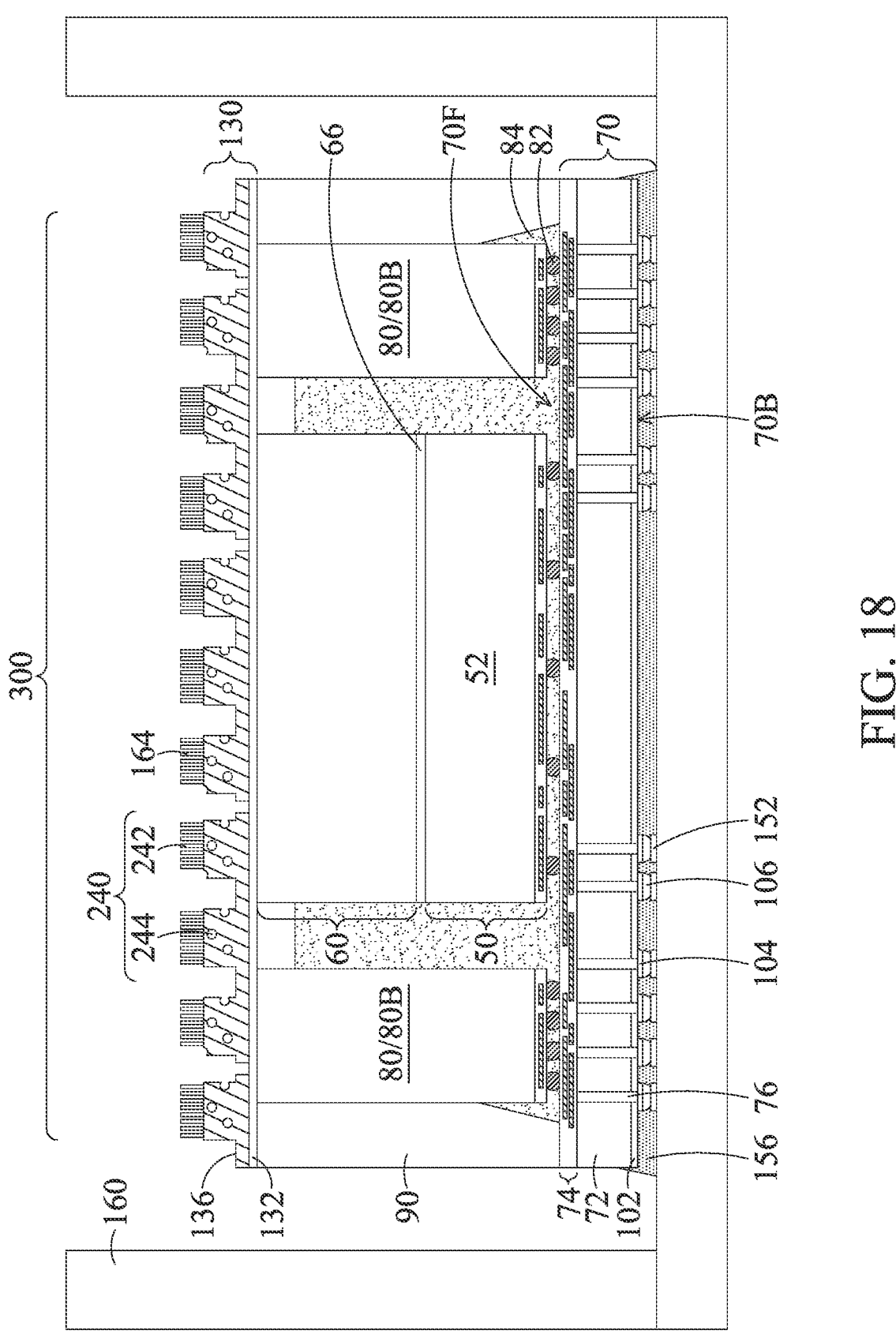

FIGS. 16 to 18 illustrate cross-sectional views of the intermediate stages of manufacturing an integrated circuit package 200 and an integrated circuit package 300, respectively, in accordance with some embodiments. The integrated circuit package 200 and 300 may be formed using similar processing strep for the integrated circuit package 200, and porous pillars 240 are used, wherein like reference numbers represent like elements. In particular, the processing illustrated in FIG. 16 assumes the processing illustrated in FIGS. 1 to 11A was performed prior. Accordingly, after the processing discussed above with reference to FIGS. 1 to 11A, processing may proceed to FIG. 16. In FIG. 16, the porous pillars 240 are formed over the heat spreading layer 134. The porous pillars 240 may have a similar height and width to the pillars 140. The porous pillars 240 may include a bulk material 242 formed of a metal material, such as aluminum, copper, nickel, cobalt, silver, titanium, iron, an alloy thereof, or a combination thereof, or other materials, such as silicon carbide, aluminum nitride, other suitable metals, and the like, which may be similar to that of the pillars 140. Pores 244 are within the bulk material 242. The pores 244 may be a spherical shape or the like. In some embodiments, the porous pillars 240 may be like a metal foam. In some embodiments, the pores 244 may be nano-pores and have an average diameter ranging from 1 nm to 100 nm.

For example, a mask layer (not shown), such as a photoresist layer, may be formed over the metal layer 132. The mask layer may be patterned to have openings that have a pattern corresponding to the porous pillars 240. The porous pillars 240 may then be deposited in the openings by electroplating using a dynamic hydrogen bubble templating (DHBT) technique. For example, during the electroplating, hydrogen bubbles may be introduced into the plating solution to disrupt the growth of the bulk material of the porous pillars 240, thereby acting as a dynamic template for electroplating the porous pillars 240. The porous pillars 240 may provide pores in nano-dimensions, which may increase the rate of wicking the surface of the heat dissipation structure by capillary action.

In some embodiments, the size of the pores 244 of the porous pillars 240 is adjusted by the concentration of the hydrogen bubbles (or the rate of introducing the hydrogen), the pH value or solvent of the plating solution, and the additives in the plating solution. In some embodiment, the solvent of the plating solution may include water, $NH_4$, HCl, or other suitable acidic or basic solutions, with a pH value ranging from 4 to 9.

After forming the porous pillars 240, the processing described in FIGS. 13 to 14 is proceeded. In some embodiments, the subsequent processing does not include the processing steps of forming the nanostructures 164 as illustrated in FIG. 15, and the integrated circuit package 200 as illustrated in FIG. 17 is formed. In some embodiments, the subsequent processing includes the processing steps of forming the nanostructures 164 as illustrated in FIG. 15, and the integrated circuit package 300 as illustrated in FIG. 18 is formed. In such embodiments, the volumes of the pores in the porous pillars may be up to 50% of the volumes of the pillars 140 so that a rigid base for forming the nanostructures 164 can be provided.

Figure 19:
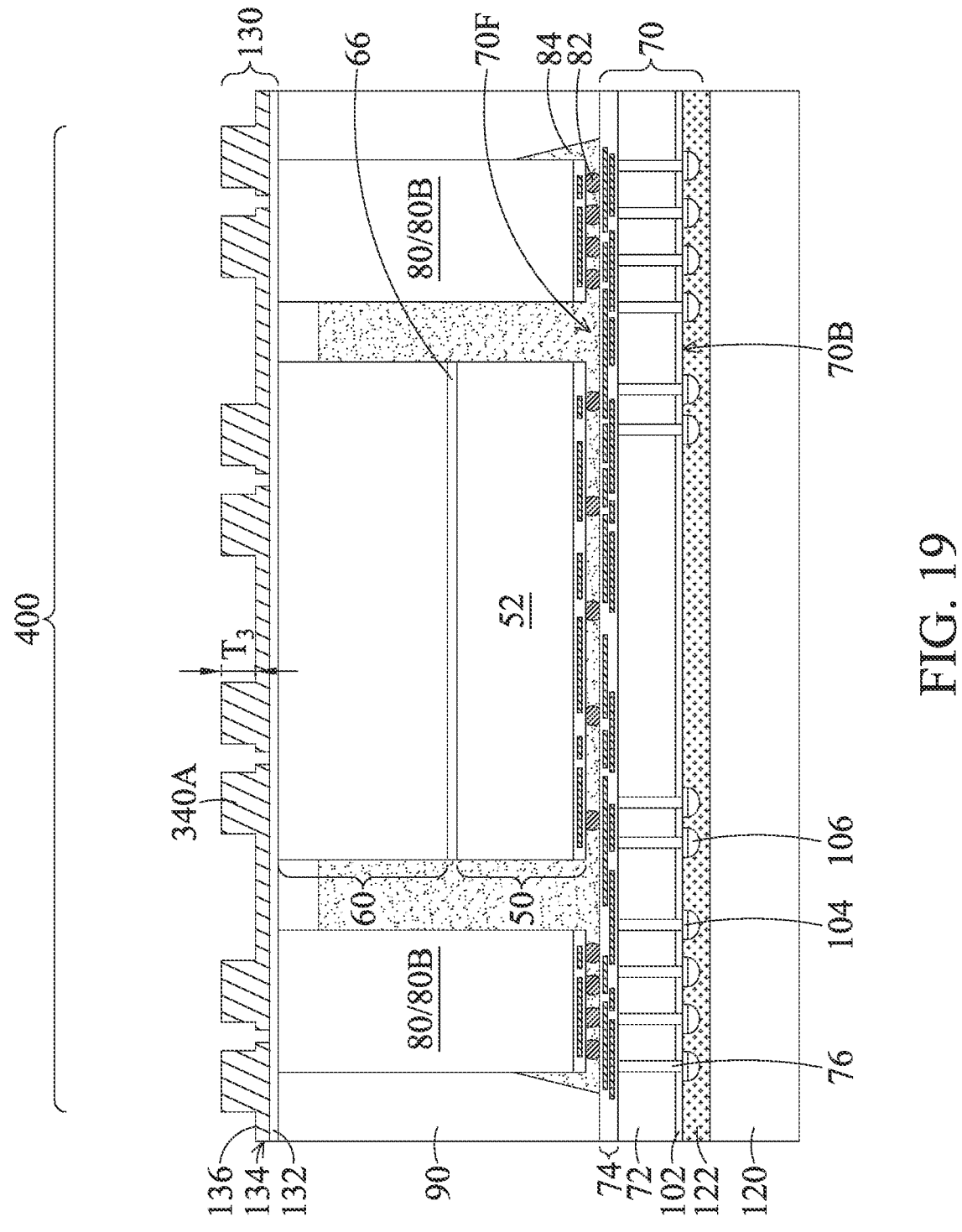
FIGS. 19 to 21 are cross-sectional views of intermediate stages in the manufacturing of an integrated circuit package, in accordance with some embodiments.
Figure 20:
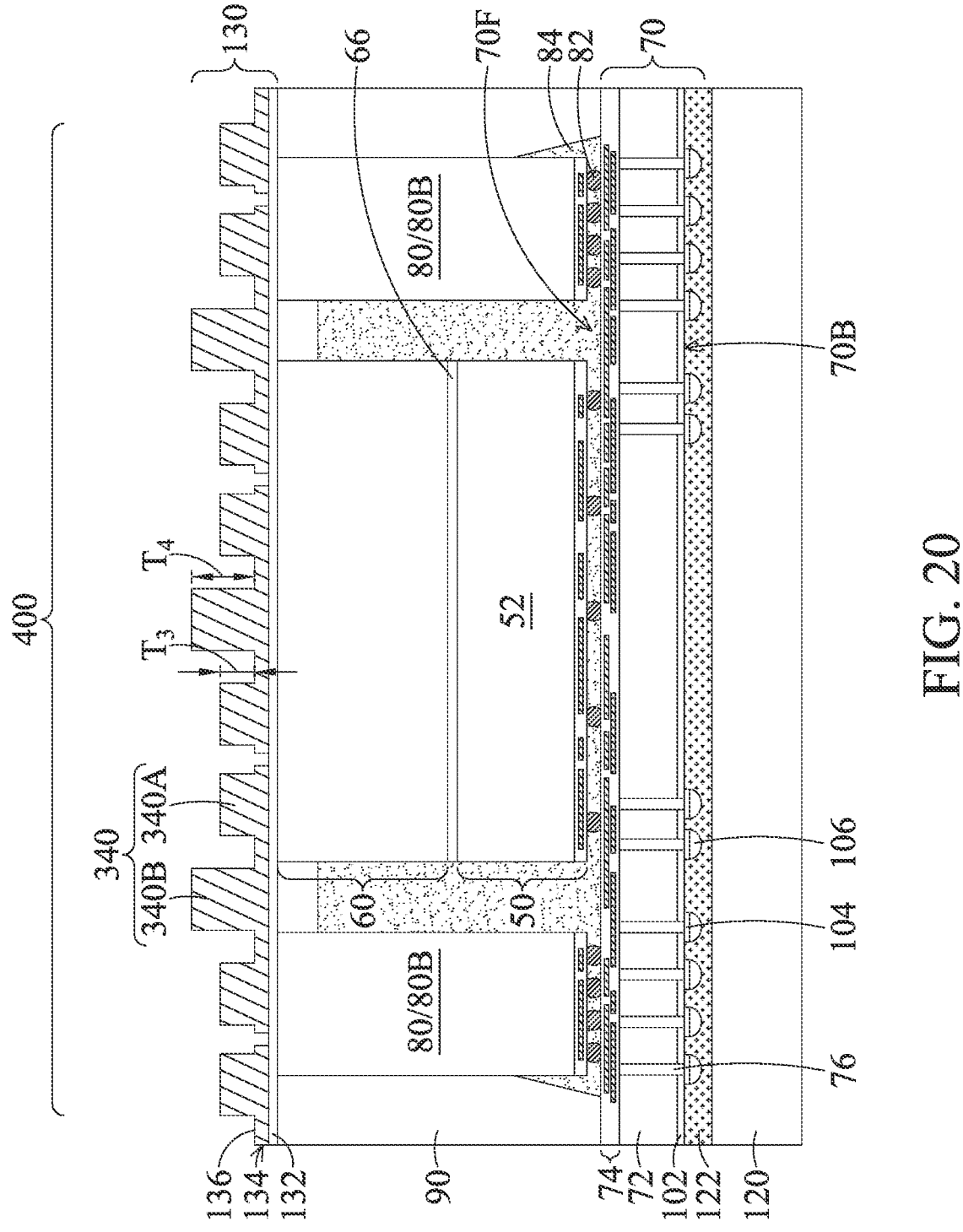
Figure 21:
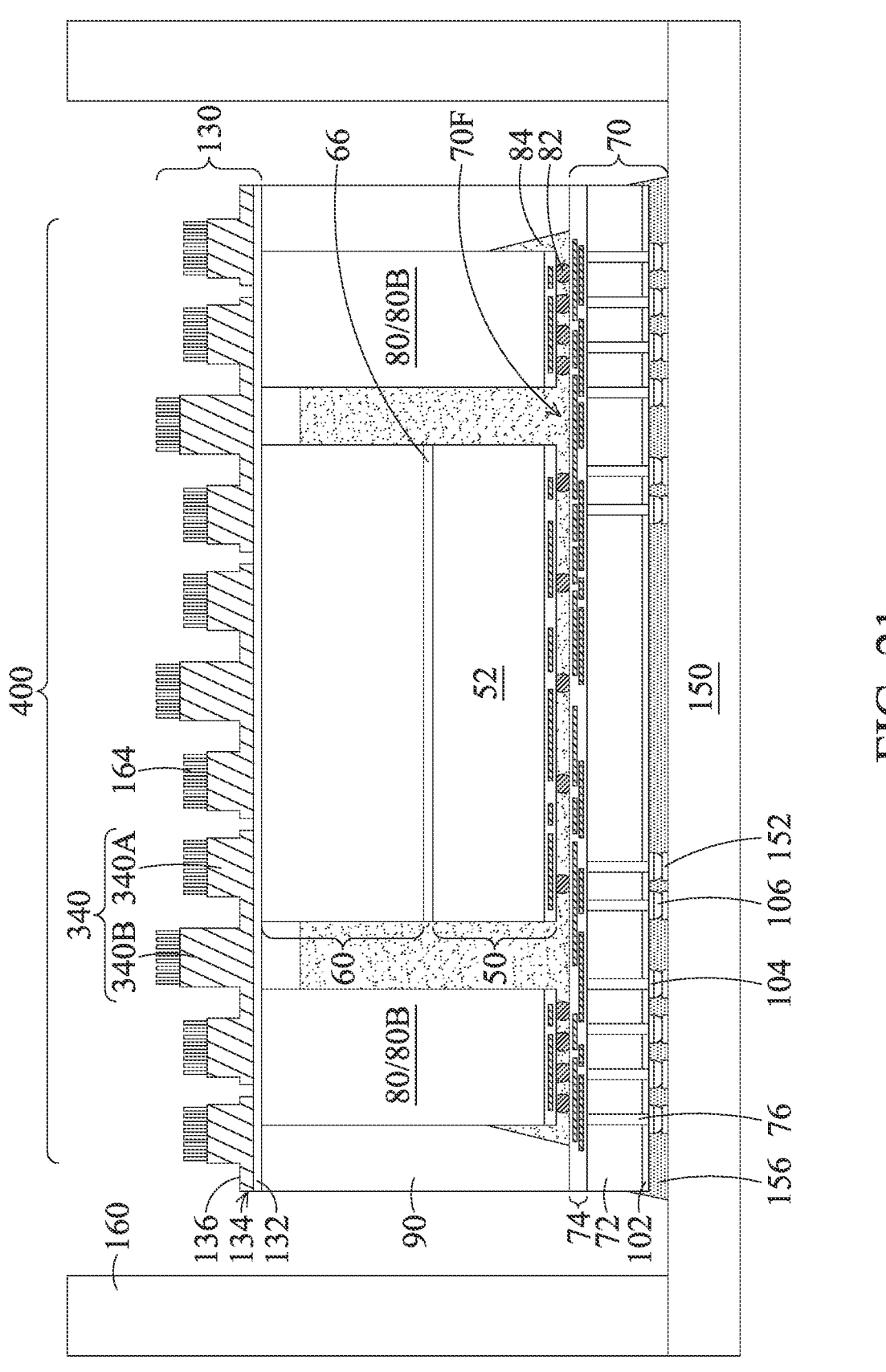

FIGS. 19 to 21 illustrate cross-sectional views of at intermediate stages of manufacturing an integrated circuit package 400, in accordance with some embodiments. The integrated circuit package 400 may be formed using similar processing strep for the integrated circuit package 200, and first pillars 340A and second pillars 340B (collectively referred to as pillars 340) with multiple thicknesses are used, wherein like reference numbers represent like elements. In particular, the processing illustrated in FIG. 19 assumes the processing illustrated in FIGS. 1 to 11A performed prior. Accordingly, after the processing discussed above with reference to FIGS. 1 to 11A, processing may proceed to FIG. 19. In FIG. 19, first pillars 340A are formed over the metal layer 132 by forming a first mask layer having openings over the metal layer 132, and depositing the first pillars 340A in the openings of the first mask layer to a first thickness $T_3$. The openings of the second mask layer may be at locations corresponding to the first pillars 340A. The first mask layer may then be removed by lifting or ashing. Next, in FIG. 20, second pillars 340B may be formed over the metal layer and adjacent to the first pillars 340A by forming a second mask layer (e.g., a patterned photoresist layer) having openings over the metal layer 132 and depositing the second pillars 340B in the openings of the second mask layer to a second thickness $T_4$. The openings of the second mask layer may be at locations corresponding to the second pillars 340B and not expose the first pillars 340A. The second mask layer may then be removed by lifting or ashing. The first thickness $T_3$ may be in a range from 10 um to 30 um. The second thickness $T_4$ is greater than the first thickness $T_3$, such as in a range from 40 um to 100 um.

It is appreciated that the formation sequence of forming the first pillars 340A and the second pillars 340B may be exchanged, and more thicknesses of the pillars 340 may be used or implemented. The deposition of the first pillars 340A and the second pillars 340B may be similar to each other, and the achievement of thicknesses $T_3$ and $T_4$ may be controlled by the deposition time. In some embodiments, the deposition of the first pillars 340A and the second pillars 340B may be similar to the deposition of the pillars 140 and have a structure similar to the pillars 140. In some embodiments, the deposition of the first pillars 340A and the second pillars 340B may be similar to the deposition of the porous pillars 240 and have a structure similar to the porous pillars 240. After forming the first pillars 340A and second pillars 340B, the processing described in FIGS. 13 to 15 proceeds, and the resulting structure of the integrated circuit package 400 is obtained, as illustrated in FIG. 21.

A package including integrated circuit devices attached to an interposer and a method of forming the same are provided in accordance with some embodiments. A heat dissipation structure is attached to the integrated circuit devices. The heat dissipation structure may include macrostructures, such as a heat spreading layer and pillars over the heat spreading layer to provide the heat dissipation structure with increased surface area as compared to a flat layer. Also, the heat dissipation structure includes microstructures, such as nano-structures over the pillars or nanosized pores in the pillars for increasing the wicking rate of the surface of the heat dissipation structure. Thus, the heat dissipation structure may effectively take advantage of the latent heat of cooling fluid and not be limited by a boiling vapor film or bubbles. Accordingly, an integrated circuit package having effective heat dissipation efficiency and capacity may be provided.

In an embodiment, a package includes an integrated circuit device attached to a substrate; an encapsulant disposed over the substrate and laterally around the integrated circuit device, wherein a top surface of the encapsulant is coplanar with the top surface of the integrated circuit device; and a heat dissipation structure disposed over the integrated circuit device and the encapsulant, wherein the heat dissipation structure includes a spreading layer disposed over the encapsulant and the integrated circuit device, wherein the spreading layer includes a plurality of islands, wherein at least a portion of the islands are arranged as lines extending in a first direction in a plan view; a plurality of pillars disposed over the islands of the spreading layer; and nano-structures disposed over the pillars. In an embodiment, the islands of the spreading layer have a height smaller than a width or a length of the islands of the spreading layer, wherein the pillars have a thickness greater than a width or a length of the pillars. In an embodiment, a first group of the islands includes a first portion of the islands, and a second group of the islands includes a second portion of the islands, wherein the first portion of the islands and the second portion of the islands are staggered in the first direction. In an embodiment, the heat dissipation structure further includes a metal layer disposed over the integrated circuit device and the encapsulant and below the spreading layer, wherein the metal layer includes TiNiCu, AlNiVCu or a combination thereof. In an embodiment, a total surface area of top surfaces of the pillars is over 50% of a total surface area of top surfaces of the integrated circuit device and the encapsulant. In an embodiment, the pillars include a bulk material and nano-pores in the bulk material of the pillars. In an embodiment, the nanostructures are nanowires erected over the pillars. In an embodiment, the nanostructures include Cu, CuO, Ni, or a combination thereof. In an embodiment, the outermost pillar of the pillars has a distance ranging from 50 um to 500 um to an edge of the encapsulant. In an embodiment, the package further includes a ring structure laterally surrounding the encapsulant and the heat dissipation structure, wherein a top surface of the ring structure is higher than a top surface of the heat dissipation structure.

In an embodiment, a package includes an integrated circuit device attached to an interposer, wherein the integrated circuit device includes a first heat dissipation structure attached to an integrated circuit die; an encapsulant disposed over the interposer and laterally around the integrated circuit device, wherein a top surface of the encapsulant is coplanar with the top surface of the integrated circuit device; and a second heat dissipation structure in physical contact with the first heat dissipation structure of the integrated circuit device and the encapsulant, wherein the second heat dissipation structure includes a first island and a second island disposed over the encapsulant and the integrated circuit device; a first pillar disposed over the first island, wherein the first pillar has a thickness greater than a width of the first pillar in a first direction; and a second pillar disposed over the first island, wherein the second pillar has a thickness greater than a width of the second pillar in the first direction, wherein each of the first pillar and the second pillar has a bulk material and nano-pores in the bulk material. In an embodiment, the second heat dissipation structure further includes nanostructures disposed over the first pillar and the second pillar. In an embodiment, the first pillar and the second pillar have different thicknesses. In an embodiment, the first island and the second island are aligned in the first direction and partially staggered in a second direction perpendicular to the first direction. In an embodiment, the first island and the second island are aligned in a second direction perpendicular to the first direction and partially staggered in the first direction.

In an embodiment, a method of forming a package is provided. The method includes attaching an integrated circuit device to a substrate; forming an encapsulant over the substrate and around the integrated circuit device; forming a spreading layer over the integrated circuit device and the encapsulant, wherein the spreading layer includes a plurality of islands; forming pillars over the islands of the spreading layer; and forming nanostructures over the pillars. In an embodiment, the substrate is an interposer including conducting vias partially penetrating the interposer, wherein the method includes thinning the interposer to reveal the conducting vias before forming the nanostructures. In an embodiment, each of forming the pillars and forming the nanostructures include electroplating. In an embodiment, a plating solution of the electroplating for forming the pillars includes hydrogen bubbles. In an embodiment, the plating solution includes NH4, HCl, polyethylene glycol, or a combination thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
an integrated circuit device attached to a substrate;
an encapsulant disposed over the substrate and laterally around the integrated circuit device, wherein a top surface of the encapsulant is coplanar with a top surface of the integrated circuit device; and
a heat dissipation structure disposed over the integrated circuit device and the encapsulant, wherein the heat dissipation structure comprises:
a spreading layer disposed over the encapsulant and the integrated circuit device, wherein the spreading layer comprises a plurality of islands, wherein at least a portion of the islands are arranged as lines extending in a first direction in a plan view;
a plurality of pillars disposed over the islands of the spreading layer; and
nanostructures disposed over the pillars.

2. The package of claim 1, wherein the islands of the spreading layer have a height smaller than a width or a length of the islands of the spreading layer, wherein the pillars have a thickness greater than a width or a length of the pillars.

3. The package of claim 1, wherein a first group of the islands comprises a first portion of the islands, and a second group of the islands comprises a second portion of the islands, wherein the first portion of the islands and the second portion of the islands are staggered in the first direction.

4. The package of claim 1, wherein the heat dissipation structure further comprises a metal layer disposed over the integrated circuit device and the encapsulant and below the spreading layer, wherein the metal layer comprises TiNiCu, AlNiVCu, or a combination thereof.

5. The package of claim 1, wherein a total area of top surfaces of the pillars is over 50% of a total area of top surfaces of the integrated circuit device and the encapsulant.

6. The package of claim 1, wherein the pillars comprise a bulk material and nano-pores in the bulk material of the pillars.

7. The package of claim 1, wherein the nanostructures are nanowires erected over the pillars.

8. The package of claim 1, wherein the nanostructures comprise Cu, CuO, Ni, or a combination thereof.

9. The package of claim 1, wherein the outermost pillar of the pillars has a distance ranging from 50 um to 500 um to an edge of the encapsulant.

10. The package of claim 1, further comprising a ring structure laterally surrounding the encapsulant and the heat dissipation structure, wherein a top surface of the ring structure is higher than a top surface of the heat dissipation structure.

11. A package comprising:
an integrated circuit device attached to an interposer, wherein the integrated circuit device comprises a first heat dissipation structure attached to an integrated circuit die;
an encapsulant disposed over the interposer and laterally around the integrated circuit device, wherein a top surface of the encapsulant is coplanar with a top surface of the integrated circuit device; and
a second heat dissipation structure in physical contact with the first heat dissipation structure of the integrated circuit device and the encapsulant, wherein the second heat dissipation structure comprises:
a first island and a second island disposed over the encapsulant and the integrated circuit device;
a first pillar disposed over the first island, wherein the first pillar has a thickness greater than a width of the first pillar in a first direction; and
a second pillar disposed over the first island, wherein the second pillar has a thickness greater than a width of the second pillar in the first direction, wherein each of the first pillar and the second pillar has a bulk material and nano-pores in the bulk material.

12. The package of claim 11, wherein the second heat dissipation structure further comprises nanostructures disposed over the first pillar and the second pillar.

13. The package of claim 11, wherein the first pillar and the second pillar have different thicknesses.

14. The package of claim 11, wherein the first island and the second island are aligned in the first direction and partially staggered in a second direction perpendicular to the first direction.

15. The package of claim 11, wherein the first island and the second island are aligned in a second direction perpendicular to the first direction and partially staggered in the first direction.

16. A package comprising:
a device layer over an interposer, wherein the device layer includes one or more integrated circuit dies and an encapsulant disposed over the interposer and laterally around the one or more integrated circuit dies;
a first island disposed over the device layer;
a second island disposed over the device layer, the first island being spaced apart from the second island;
a first pillar disposed over the first island;
a second pillar disposed over the first island, wherein each of the first pillar and the second pillar has a bulk material and pores in the bulk material;
first nanostructures disposed over the first pillar; and
second nanostructures disposed over the second pillar.

17. The package of claim 16, wherein the first pillar has a thickness greater than a width of the first pillar in a first direction, and wherein the second pillar has a thickness greater than a width of the second pillar in the first direction.

18. The package of claim 16, wherein the one or more integrated circuit dies include a first integrated circuit die, wherein the package further comprises:
a first heat dissipation structure attached to the first integrated circuit die, wherein a top surface of the encapsulant is coplanar with a top surface of the first heat dissipation structure.

19. The package of claim 16, wherein the first pillar and the second pillar have different thicknesses.

20. The package of claim 16, wherein the one or more integrated circuit dies include a first integrated circuit die, wherein the first island overlaps an interface between the first integrated circuit die and the encapsulant.

* * * * *